US012635302B2

(12) United States Patent
Zhu et al.

(10) Patent No.: US 12,635,302 B2
(45) Date of Patent: May 19, 2026

(54) ASYMMETRIC MULTI-OPENING DISPLAY PANEL AND APPARATUS

(71) Applicant: Hubei Yangtze Industrial Innovation Center of Advanced Display Co., LTD., Wuhan (CN)

(72) Inventors: Shengtao Zhu, Shanghai (CN); Yang Zeng, Shanghai (CN); Shihao Tang, Shanghai (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 599 days.

(21) Appl. No.: 17/975,301

(22) Filed: Oct. 27, 2022

(65) Prior Publication Data

US 2024/0038935 A1     Feb. 1, 2024

(30) Foreign Application Priority Data

Jul. 29, 2022    (CN) .......................... 202210908712.8

(51) Int. Cl.
*H10H 20/831*          (2025.01)
(52) U.S. Cl.
CPC ............................... *H10H 20/8312* (2025.01)
(58) Field of Classification Search
CPC ........... H10H 20/8312; H10H 20/0363; H10H 20/855; H10H 20/831; H10D 86/60; H10D 86/451; H10D 86/40; H01L 25/0753; H01L 25/167
See application file for complete search history.

(56) References Cited

U.S. PATENT DOCUMENTS

2021/0098650 A1*  4/2021  Lin ...................... H10H 20/821
2021/0288291 A1*  9/2021  Lee ...................... H10K 59/122
2022/0246881 A1*  8/2022  Lee ...................... H10K 50/844

FOREIGN PATENT DOCUMENTS

CN        111769211 A      10/2020
CN        112420782 A       2/2021
CN        114361359 A   *   4/2022

* cited by examiner

*Primary Examiner* — Eliseo Ramos Feliciano
*Assistant Examiner* — Sophia W Kao
(74) *Attorney, Agent, or Firm* — Anova Law Group, PLLC

(57)          ABSTRACT

A display panel and display apparatus are provided in the present disclosure. The display panel includes a substrate; a first insulating layer disposed on a side of the substrate; a first electrode layer disposed on a side of the first insulating layer away from the substrate; a light-blocking layer disposed on a side of the first electrode layer away from the first insulating layer; and an opening combination, including a first opening and a second opening which correspond to each other. The first opening passes through the light-blocking layer along a direction perpendicular to a plane of the substrate; the second opening is at least in the first insulating layer; the opening combination includes an asymmetric design; and/or the first electrode layer at a position corresponding to the second opening is a non-planar structure.

24 Claims, 17 Drawing Sheets

100

20

20

200

100

ASYMMETRIC MULTI-OPENING DISPLAY PANEL AND APPARATUS

CROSS-REFERENCE TO RELATED APPLICATION

Present disclosure claims the priority of Chinese Patent Application No. 202210908712.8, filed on Jul. 29, 2022, the content of which is incorporated herein by reference in its entirety.

TECHNICAL FIELD

The present disclosure generally relates to the field of display technology and, more particularly, relates to a display panel and a display apparatus.

BACKGROUND

In the existing technology, when light-transmitting holes are disposed in a part of a display panel, the light-transmitting holes may be configured to, for example, be cooperated to realize the photosensitive function of photosensitive elements. Those skilled in the art have found that disposing the light-transmitting holes may lead to display problems such as uneven display in some regions of the display panel. For example, the display brightness at the position of the light-transmitting holes may be high, which may affect the display effect of the display panel. Therefore, there is a need to improve the display effect of the display panel including the light-transmitting holes and ensure the photosensitive function of the display panel.

SUMMARY

One aspect of the present disclosure provides a display panel. The display panel includes a substrate; a first insulating layer disposed on a side of the substrate; a first electrode layer disposed on a side of the first insulating layer away from the substrate; a light-blocking layer disposed on a side of the first electrode layer away from the first insulating layer; and an opening combination, including a first opening and a second opening which correspond to each other. The first opening passes through the light-blocking layer along a direction perpendicular to a plane of the substrate; the second opening is at least in the first insulating layer; the opening combination includes an asymmetric design; and/or the first electrode layer at a position corresponding to the second opening is a non-planar structure.

Another aspect of the present disclosure provides a display apparatus including a display panel. The display panel includes a substrate; a first insulating layer disposed on a side of the substrate; a first electrode layer disposed on a side of the first insulating layer away from the substrate; a light-blocking layer disposed on a side of the first electrode layer away from the first insulating layer; and an opening combination, including a first opening and a second opening which correspond to each other. The first opening passes through the light-blocking layer along a direction perpendicular to a plane of the substrate; the second opening is at least in the first insulating layer; the opening combination includes an asymmetric design; and/or the first electrode layer at a position corresponding to the second opening is a non-planar structure.

Other aspects of the present disclosure may be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to explain the principles of the present disclosure.

DETAILED DESCRIPTION

Figure 1:
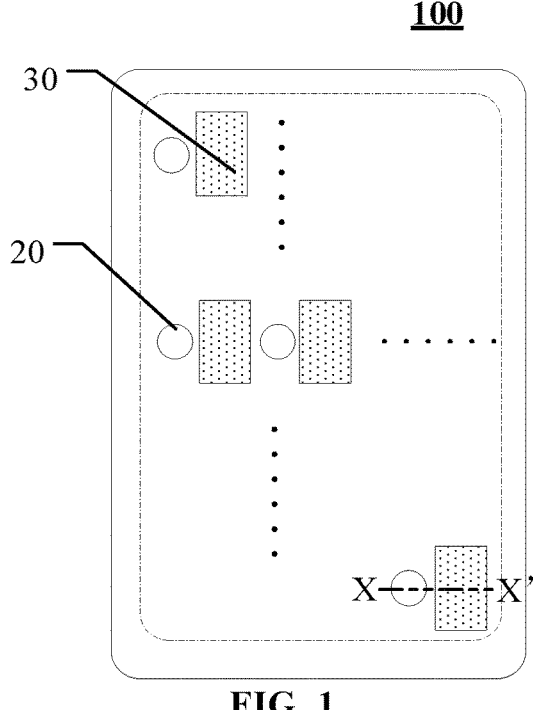
FIG. 1 illustrates a schematic of a display panel according to various embodiments of the present disclosure.

Various exemplary embodiments of the present disclosure are described in detail with reference to accompanying drawings. It should be noted that unless specifically stated otherwise, relative arrangement of components and steps, numerical expressions and values described in these embodiments may not limit the scope of the present disclosure.

Following description of at least one exemplary embodiment may be merely illustrative and may not be used to limit the present disclosure and its application or use.

The technologies, methods and apparatuses known to those skilled in the art may not be discussed in detail, but where appropriate, the technologies, methods and apparatuses should be regarded as a part of the present disclosure.

In all examples shown and discussed herein, any specific value should be interpreted as merely exemplary, rather than as a limitation. Therefore, other examples in exemplary embodiment may have different values.

It should be noted that similar reference numerals and letters are used to indicate similar items in following drawings. Therefore, once an item is defined in one drawing, it does not need to be further discussed in subsequent drawings.

In CFOT (color filter on TFE (thin film encapsulation), no polarizer technology) type display panels, it is often necessary to dispose light-transmitting holes in local parts of the display panels to cooperate with optical FODs (fingerprint on display, under-screen fingerprint recognition technology), ambient light sensors, or the like. The light-transmitting holes include openings disposed in the BM (black matrix, that is, light-blocking) layer passing through the thickness of the film layer. The opening may lead to the exposure of the highly reflective cathode disposed in the film layer below the opening. Therefore, the light incident from the opening may be reflected by the highly reflective cathode and then exit from the opening again, which may result in an increase in overall reflectivity of the display panel and further result in poor display effect of the display panel.

The present display provides a display panel and a display apparatus, which are configured to avoid the problem of poor display effect of the display panel when the BM layer is disposed with light-transmitting holes.

Figure 2:
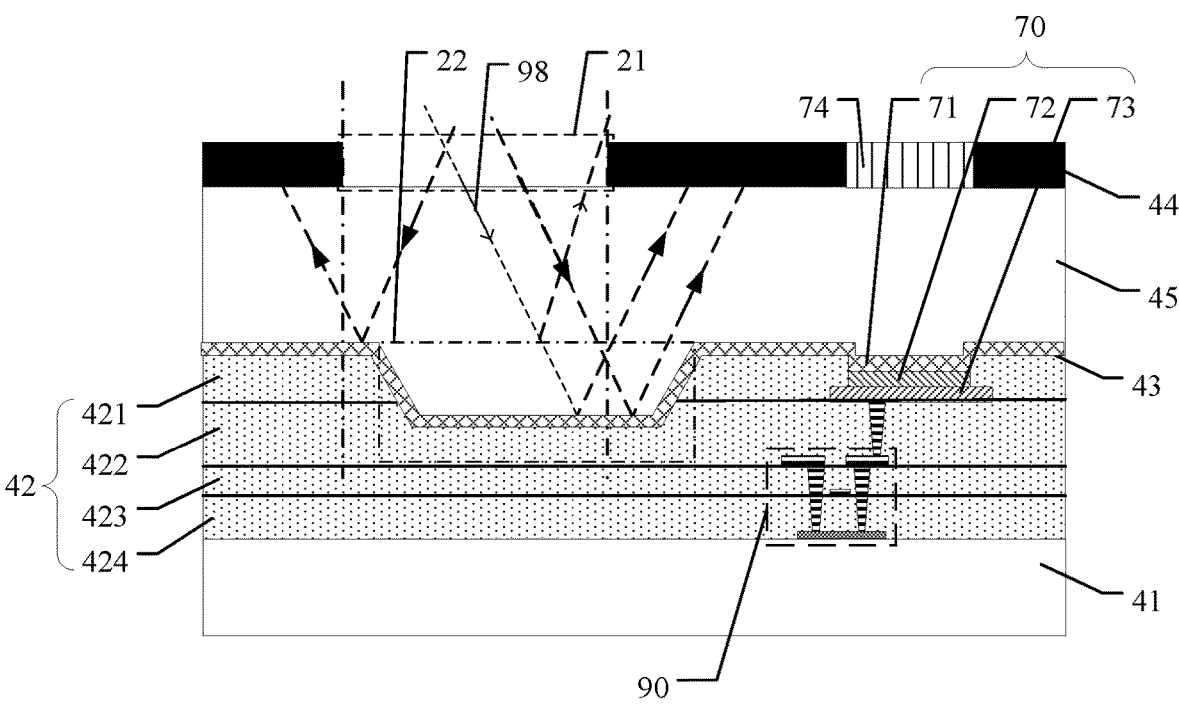
FIG. 2 illustrates a cross-sectional view along an XX' direction in FIG. 1 according to various embodiments of the present disclosure.
Figure 3:
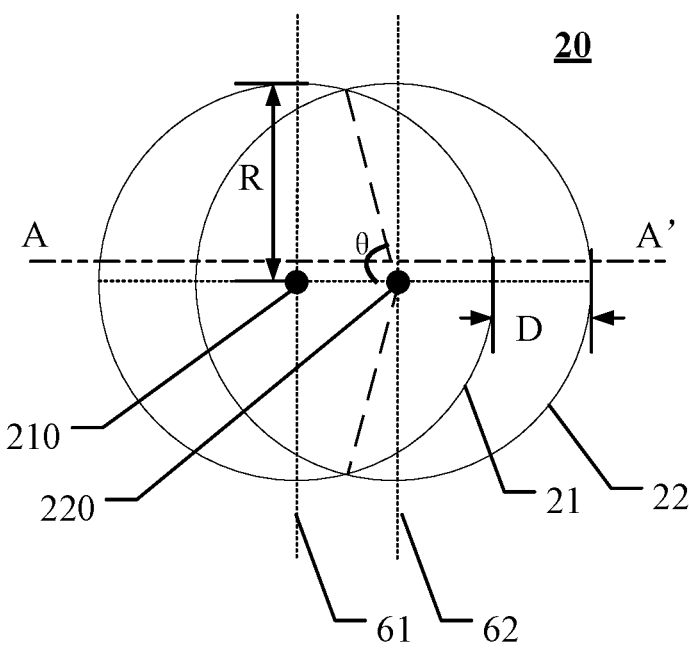
FIG. 3 illustrates a perspective view of an opening combination in FIG. 1 according to various embodiments of the present disclosure.
Figure 4:
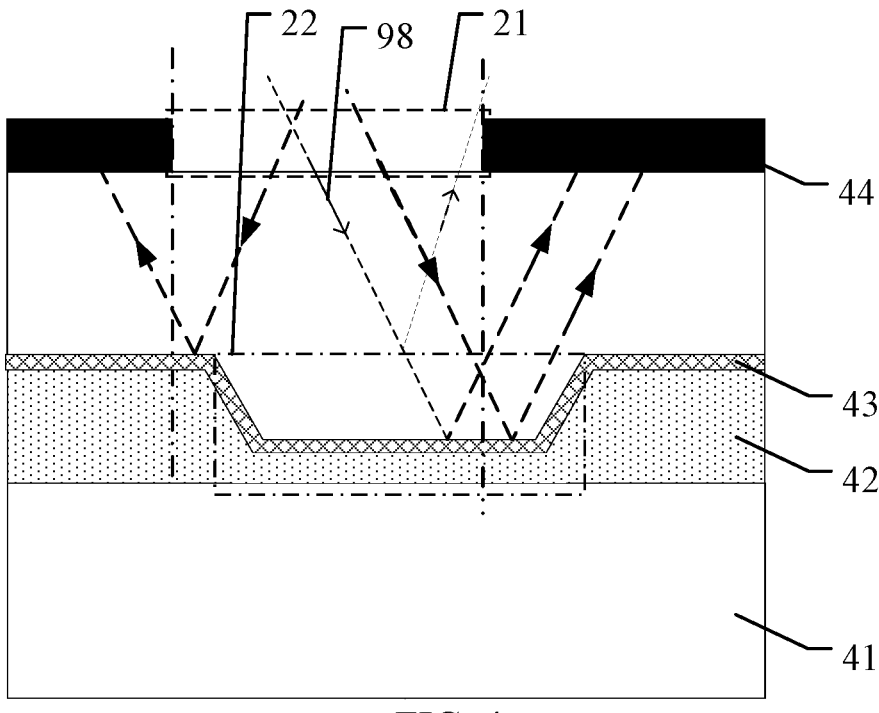
FIG. 4 illustrates a cross-sectional view along an AA' direction in FIG. 3 according to various embodiments of the present disclosure.
Figure 5:
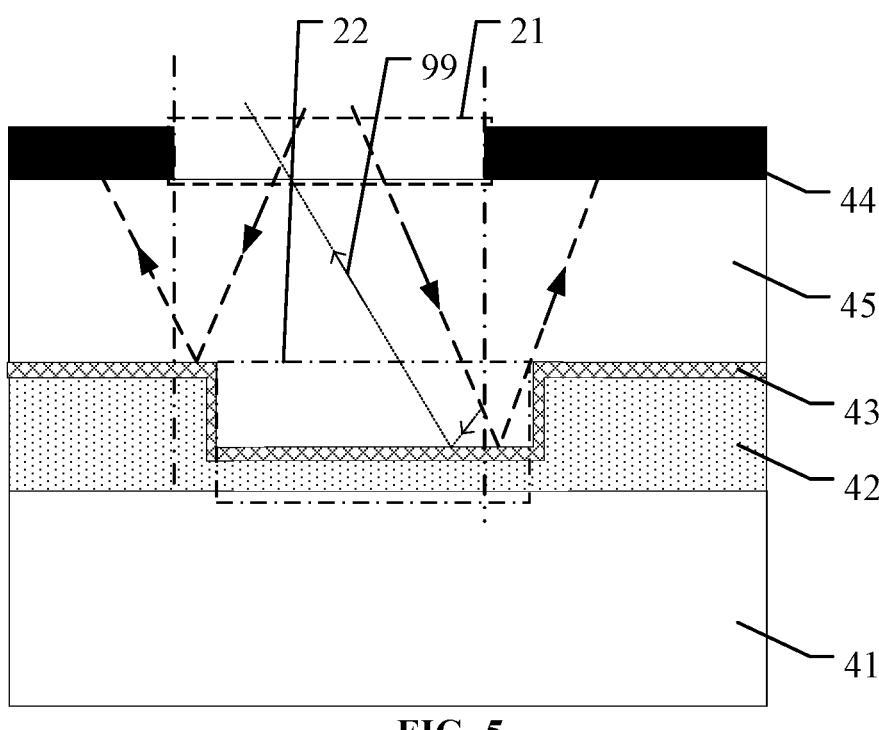
FIG. 5 illustrates another cross-sectional view along an AA' direction in FIG. 3 according to various embodiments of the present disclosure.
Figure 6:
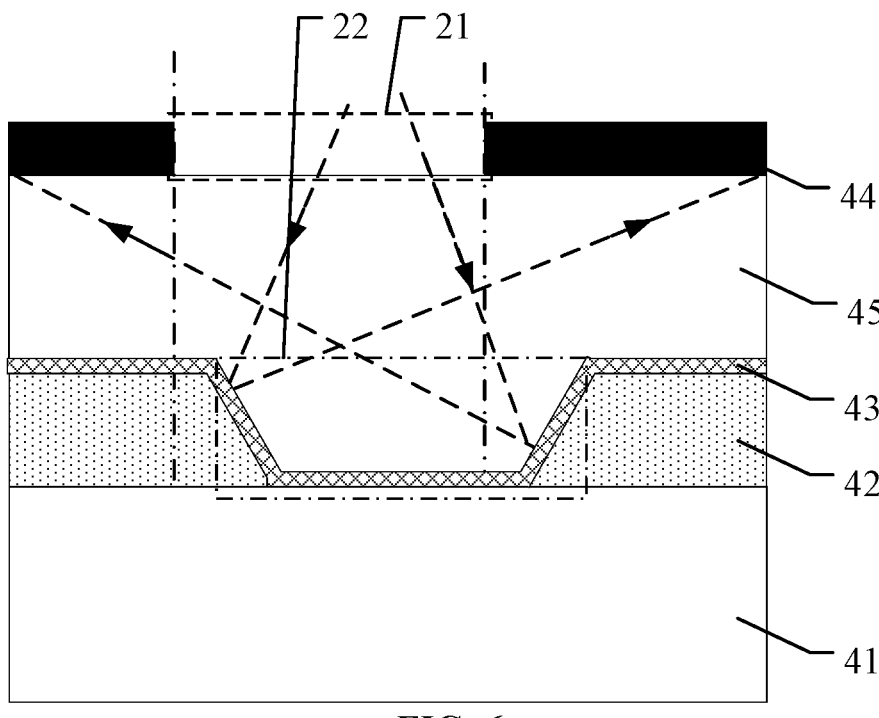
FIG. 6 illustrates another cross-sectional view along an AA' direction in FIG. 3 according to various embodiments of the present disclosure.

FIG. 1 illustrates a schematic of a display panel according to various embodiments of the present disclosure. FIG. 2 illustrates a cross-sectional view along an XX' direction in FIG. 1 according to various embodiments of the present disclosure. FIG. 3 illustrates a perspective view of an opening combination in FIG. 1 according to various embodiments of the present disclosure. FIG. 4 illustrates a cross-sectional view along an AA' direction in FIG. 3 according to various embodiments of the present disclosure. FIG. 5 illustrates another cross-sectional view along the AA' direction in FIG. 3 according to various embodiments of the present disclosure. FIG. 6 illustrates another cross-sectional view along the AA' direction in FIG. 3 according to various embodiments of the present disclosure.

Referring to FIGS. 1-6, the present disclosure provides a display panel 100. The display panel 100 may include a substrate 41, a first insulating layer 42 disposed on a side of the substrate 41, a first electrode layer 43 disposed on a side of the first insulating layer 42 away from the substrate 41, and a light-blocking layer 44 disposed on a side of the first electrode layer 43 away from the first insulating layer 42; and further include an opening combination 20 including a first opening 21 and a second opening 22 which correspond to each other. The first opening 21 may pass through the light-blocking layer 44 along the direction perpendicular to the plane of the substrate 41; and the second opening 22 may be at least in the first insulating layer 42. The opening combination 20 may be an asymmetric design; and/or the first electrode layer 43 at the position corresponding to the second opening 22 may be a non-planar structure.

For example, the substrate 41, the first insulating layer 42, the first electrode layer 43, and the light-blocking layer 44 included in the display panel 100 may be disposed to be stacked with each other. The light-transmitting region 45 with a certain thickness may be included between the light-blocking layer 44 and the first electrode layer 43. The light-transmitting region 45 may be configured to allow light to pass through without affecting the exit direction of the light.

In addition, as shown in FIG. 2, the first insulating layer 42 may include a first sub-insulating layer 424, a second sub-insulating layer 423, a planarization layer 422 and a pixel defining layer 421 which are arranged in sequence. The display panel 100 may further include a drive circuit, where the drive transistor 90 included in the drive circuit may be disposed in the first insulating layer 42. For example, the semiconductor layer of the drive transistor 90 may be disposed in the first sub-insulating layer 424, the gate electrode of the drive transistor 90 may be disposed in the second sub-insulating layer 423, and the source and drain electrodes of the drive transistor 99 may be disposed in the planarization layer 422. The light-emitting element 70 may be disposed in the pixel defining layer 421. The drive transistor 90 may be electrically connected to the light-emitting element 70 for controlling whether an electrical signal may be sent to the light-emitting element 70, thereby controlling whether the light-emitting element 70 is in a light-emitting state or an off state. In addition, an opening corresponding to the light-emitting element may be formed in the light-blocking layer 44, which may be configured for the light emitted by the light-emitting element 70 to exit, thereby realizing normal display function of the display panel 100. A color resist 74 may be disposed in the opening above the light-emitting element 70, thereby realizing diversified color display of the display panel 100. The light-emitting element may include a first electrode 71, a light-emitting layer 72 and a second electrode 73; the light-emitting layer 72 may be between the first electrode 71 and the second electrode 73; and the first electrode layer 43 may include the first electrode 71. It should also be noted that 45 shown in FIG. 2 is equivalent to an encapsulation layer in the display panel 100, which may be rigid encapsulation. If 45 shown here is formed of an inorganic insulating layer, an organic insulating layer and an inorganic insulating layer which are disposed to be stacked with each other, TFE (thin film encapsulation) may also be used.

The display panel 100 may include at least one opening combination 20, and each opening combination 20 may include the first opening 21 and the second opening 22 which are disposed oppositely. Herein, the first opening 21 and the second opening 22 are correspondingly disposed oppositely, which may be that the orthographic projection of the first opening 21 on the plane of the substrate 41 may be partially overlapped with the orthographic projection of the second opening 22 on the plane of the substrate 41. That is, the orthographic projections of both the first opening 21 and the second opening 22 included in one opening combination 20 on the plane of the display panel 100 may need to have an overlapped region, thereby realizing that the functions of the components disposed at the first opening 21 and/or the second opening 22 may work normally. The first opening 21 and the second opening 22 included in the opening combination 20 may not be two openings that the orthographic projections on the plane of the display panel 100 are spaced apart from each other. In the present disclosure, the first opening 21 may be disposed in the light-blocking layer 44, and the first opening 21 may be formed by passing through the thickness of entire light-blocking layer 44, so that light may enter/exit through the first opening 21. In the present disclosure, the second opening 22 may be disposed in the first insulating layer 42. Optionally, the second opening 22 may be formed by passing through entire first insulating layer 42; or a portion of the first insulating layer 42 may be removed from the surface of the first insulating layer 42 away from the substrate 41 to the side of the substrate 41 to form the second opening 22.

Based on the structure of above-mentioned display panel 100, the present disclosure provides an optional embodiment that the first opening 21 and the second opening 22 in each opening combination 20 may be disposed asymmetrically. From the top view direction of the display panel 100, for example, when the first opening 21 and the second opening 22 are both circular, it may configure that the orthographic projection of the center 210 of the first opening 21 on the plane of the substrate 41 may not be overlapped with the orthographic projection of the center 220 of the second opening 22 on the plane of the substrate 41. For example, when the first opening 21 and the second opening 22 are both squared, it may configure that the orthographic projection of the center point of the first opening 21 on the plane of the substrate 41 may not be overlapped with the orthographic projection of the center point of the second opening 22 on the plane of the substrate 41 (not shown in drawings). At this point, the present disclosure may not limit whether the orthographic projection area of the first opening 21 on the plane of the substrate 41 is same as the orthographic projection area of the second opening 22 on the plane of the substrate 41, as long as the orthographic projections of the first opening 21 and the second opening 22 on the plane of the substrate 41 do not be completely overlapped with each other. For example, from another observation angle, when being viewed along the direction perpendicular to the drawing sheet of the present disclosure, in the cross-sectional views including the first opening 21 and the second opening 22 as shown in FIGS. 4-6, the first opening 21 may be disposed to be deviated toward the left side of the opening combination 20 in the width occupied by entire opening combination 20, and the second opening 22 may be disposed to be deviated toward the right side of the opening combination 20 in the width occupied by entire opening combination 20. Or the second opening 22 in an opening combination 20 may be slightly deviated to the right side relative to the configuration position of the first opening 21. With such configuration manner, it may realize that the cross-sectional view of the opening combination 20 including the first opening 21 and the second opening 22 may be an asymmetric structure, thereby realizing the asymmetric design of the opening combination 20.

In embodiments shown in FIGS. 4-6 of the present disclosure, by configuring the cross-sectional view of both the first opening 21 and the second opening 22 as an asymmetric design, for the light incident from the first opening 21 to the surface of the first electrode layer 43 at corresponding position of the second opening 22, at least a part of the light may be reflected to the light-blocking layer 44 around the first opening 21 and absorbed by the light-blocking layer 44. For example, as shown in FIG. 5, the reflected light 99 shown by a small arrow may be the reflected light 99, corresponding incident light, formed on the surface of the first electrode layer in the case of symmetrical design of the second opening and the first opening. However, as shown in FIG. 5, when being viewed along the direction perpendicular to the drawing sheet of the present disclosure, the second opening 22 may be disposed at the position deviated to the right side relative to the first opening 21 in the present disclosure. Therefore, as shown in FIG. 5, the incident light corresponding to the reflected light 99 may be reflected by the first electrode layer 43 to the surface of the light-blocking layer 44, so that the reflected light formed by the incident light may be absorbed by the light-blocking layer 44, thereby reducing the reflected light exiting from the first opening 21. Similarly, in the present disclosure, the opening combination 20 may be designed to be asymmetric, so that for the light incident from the first opening 21 to the surface of the first electrode layer 43 at corresponding position of the second opening 22, a part of the light may be reflected by the first electrode layer 43 to the light-blocking layer 44 instead of being reflected to the first opening 21 to exit. Therefore, the amount of light exited from the first opening 21 after being reflected by the first electrode layer 43 may be reduced, and the influence of the reflected light on the display effect of the display panel 100 may be weakened, which may be beneficial for improving the display uniformity of the display panel 100 and further improving user experience.

It should be noted that since the positions for configuring the opening combination 22 are limited, in order to avoid excessive occupation of the space of the display panel 100 by configuring the opening combination 22 and to achieve the effect of reducing the reflectivity of the display panel, the first opening 21 and the second opening 22 may be configured to be staggered with each other in the present disclosure, that is, the configuration manner of the first opening 21 and the second opening 22 as shown in FIG. 5. Therefore, above-mentioned technical effect of reducing the amount of light exited from the first opening 21 after being reflected by the first electrode layer 43 may be achieved, the problem of poor reflectivity of the display panel 100 caused by the reflected light may be avoided, and excessive space increase required for the opening combination 22 may also be avoided.

In some optional embodiments of the present disclosure, as shown in FIG. 5, the orthographic projections of the first opening 21 and the second opening 22 on the plane of the substrate 41 may be both circles, and the diameter of the first opening 21 may be same as the diameter of the second opening 22. At this point, when the first opening 21 and the second opening 22 are designed to be asymmetric, the orthographic projection of the first opening 21 on the plane of the substrate 41 and the orthographic projection of the second opening 22 on the plane of the substrate 41 may have non-overlapped regions (e.g., when being viewed along the direction perpendicular to the drawing sheet of the present disclosure, the region from the left edge of the second opening 22 to the edge of the first opening 21 and the region from the right edge of the second opening 22 to the edge of the first opening 21). The area of the overlapped region of the second opening 22 and the first opening 21 may be reduced, so that the light exited to the first electrode layer 43 through the first opening 21 may not all reach the second opening 22.

In some optional embodiments of the present disclosure, when being viewed in the direction perpendicular to the drawing sheet of the present disclosure, the first electrode layer 43, at the corresponding position of the part from the right edge of the second opening 22 to the edge of the first opening 21 as shown in FIG. 4, may reflect a part of the incident light to the side of the light-blocking layer 44 to be absorbed by the light-blocking layer 44. That is, a part of the light, which is incident to the region which does not belong to the second opening 22, may be reflected by the first electrode layer 43 to the light-blocking layer 44 to be absorbed; and a part of the light, which is incident to the second opening 22 corresponding to the overlapped position of the light-blocking layer 44 may also be reflected by the first electrode layer 43 to the light-blocking layer 44 to be absorbed, thereby reducing the light exited from the first opening 21 after being reflected by the first electrode layer 43.

Based on the structure of the above display panel 100, the present disclosure also provides an optional embodiment. In one embodiment, as shown in FIG. 6, the first electrode layer 43 at the position corresponding to the second opening 22 may be a non-planar structure. The first electrode layer 43 with a non-planar structure may be used to reflect at least a part of the ambient light entering from the first opening 21 to other directions (not the direction toward the first opening 21). Compared with the first electrode layer 43 of the planar structure, the light exit direction from a part of the first electrode layer 43 may be changed. Therefore, a part of the light, which needs to exit through the first opening after being reflected by the planar first electrode layer, may change the light exit direction. A part of the light may be reflected to the surface of the side adjacent to the light-blocking layer 44, which may be absorbed by the light-blocking layer 44. Therefore, the number of light rays exiting from the first opening 21 after being reflected by the first electrode layer 43 may be reduced, which may be beneficial for weakening the influence of reflected light rays on the display effect of the display panel 100 and improving the display uniformity of the display panel 100, thereby improving the user experience.

As shown in FIG. 4, if the second opening 22 is not formed and the first electrode layer 43 is still the planar structure, the incident light 98 may exit from the first opening 21 after being reflected by the first electrode layer 43 of the planar structure. However, in the present disclosure, the second opening 22 may be configured to make that corresponding first electrode layer 43 is a non-planar structure. At this point, the incident light 98 may be reflected by the first electrode layer 43 of the non-planar structure to the surface of the side adjacent to the light-blocking layer, thereby being absorbed by the light-blocking layer 44. Similarly, in the present disclosure, by configuring the first electrode layer 43 at the position corresponding to the second opening 22 to be a non-planar structure, the reflection direction of a part of the incident light may be adjusted. Therefore, the number of light rays exiting from the first opening 21 after being reflected by the first electrode layer 43 may be reduced, which may be beneficial for weakening the influence of the reflected light rays on the display effect of the display panel 100, thereby improving the display uniformity of the display panel 100 and further improving user experience.

Furthermore, in the present disclosure, the first opening 21 and the second opening 22 in the opening combination 20 may be configured to be an asymmetric design, and the first electrode layer 43 at the position corresponding to the second opening 22 may be configured to be a non-planar structure. In such way, it may also achieve the technical effect of the number of light rays exiting from the first opening 21 after being reflected by the first electrode layer 43 may be reduced, and the influence of reflected light rays on the display panel 100 may be weakened, thereby improving the display effect of display panel 100.

It should be noted that the reason why the present disclosure can use the non-planar first electrode layer 43 to reflect at least a part of the ambient light exiting from the first opening 21 along a direction not facing toward the first opening 21 may be that the present disclosure adjusts the specific form of the non-planar structure of the first electrode layer 43 facing the side of the first opening 21. Furthermore, when the surface of the first electrode layer 43 provided in present disclosure reflects the incident light, the incident angle and reflection angle of the light may be equal. That is, the incident light may be reflected to a specific direction by the first electrode layer 43 of such non-planar structure which is specially configured, which may realize the reflection of customized direction of ambient light. Therefore, the number of light rays exiting from the first opening 21 after being reflected by the first electrode layer 43 may be reduced. The difference between the present disclosure and the manner of adjusting the reflection direction of light by using scattering particles is described in the following. In the present disclosure, the light may be reflected in a specific direction. That is, when the first electrode layer 43 reflects the incident light, the light may be reflected in a specific direction according to the reflection law that the reflection angle is equal to the incident angle. That also is, the reflection angle of the light may be equal to the angle of incidence. The "specific direction" here means that the reflection angle corresponding to the reflection direction of the light may be equal to its corresponding incident angle. For scattering particles, the light may be scattered in different directions, and the reflection directions of the light may be not specific. The scattering particles may not necessarily reduce the number of incident light rays reflected to the first opening 21 and may not achieve the technical effect of reducing overall display effect of the reflected light on the display panel 100.

It should also be noted that the display panel 100 includes a plurality of sub-pixels 30 arranged in an array. The present disclosure provides an optional configuration manner of the first openings 21, which is that the first openings 21 may be arranged to be adjacent to the sub-pixels 30 but may not have an overlapped region with the sub-pixels 30. In addition, according to requirements, the first openings 21 and the sub-pixels 30 may also be configured to have an overlapped region, which may not be limited in present disclosure.

It should be noted that above-mentioned "non-planar" may be understood as a portion on the surface of the first electrode layer 43 that is not in parallel with the plane of the substrate 41; or may be understood that the surface of the first electrode layer 43 is not in parallel with the plane of the display panel 100; or when the display panel 100 is placed horizontally, the surface of the first electrode layer 43 herein is not in parallel with the horizontal plane. For example, the surface of the first electrode layer 43 may be a curved surface; or the surface of the first electrode layer 43 may be an inclined surface, and the angle between the inclined surface and the plane of the substrate 41 may be greater than zero. That is, the first electrode layer 43 may include a portion that is not in parallel with the plane of the substrate 41.

It should also be noted that above-mentioned first insulating layer 42 may be a pixel defining layer in the display panel 100, and the pixel defining layer may be made of an organic material, such as polyimide (PI), polyamide, benzocyclobutene (BCB), acrylic resin or phenolic resin, or the like.

The first electrode layer 43 may be formed on the surface of the first insulating layer 42 at the side away from the substrate 41. The first electrode layer 43 may be fabricated by a vapor deposition process, or the first electrode layer 43 may be fabricated by a sputter deposition process. The fabrication process of the first electrode layer 43 may be after the first insulating layer 42; and the first insulating layer 42 may include an opening for defining the light-emitting element. The first electrode layer 43 may cover the position where the opening is disposed and the position where opening is not disposed in the first insulating layer 42. That is, entire surface of the first electrode layer 43 may cover the first insulating layer 42. When the evaporation deposition process is adopted, entire surface may be evaporated without using a mask with array openings. When the display panel 100 includes light-emitting elements, related fabrication sequence may be that the anode may be first fabricated, the pixel defining layer may be fabricated, the light-emitting layer may be fabricated, and the first electrode layer 43 and other film structures may be fabricated.

It should be noted that, the non-planar formation of the first electrode layer 43 at the position corresponding to the second opening 22 provided in the present disclosure may be realized by configuring at least a part of the film layer (such as the first insulating layer 42) on the side of the display panel 100 adjacent to the substrate 41 with a specific shape and structure, and there is no need to adjust the fabrication process of the first electrode layer 43. The non-planar portion of the first electrode layer 43 may be formed by being recessed toward the side of the substrate 41 relative to the horizontal portion in the first electrode layer 43 (i.e., a recessed portion may be formed); or the non-planar portion of the first electrode layer 43 may be formed by being recessed toward the side away from the substrate 41 relative to the horizontal portion in the first electrode layer 43 (i.e., a convex portion may be formed).

Referring to FIGS. 1-6, optionally, in a same opening combination 20, the orthographic projection of the second opening 22 on the plane of the substrate 41 may be at least partially overlapped with the orthographic projection of the first opening 21 on the plane of the substrate 41.

For example, as mentioned above, for any opening combination 20 provided in the display panel 100 of the present disclosure, it may configure that the orthographic projection of the second opening 22 on the plane of the substrate 41 may be at least partially overlapped with the orthographic projection of the first opening 21 on the plane of the substrate 41, such that the ambient incident light through the first opening 21 may at least partially reach on the surface of the second opening 22. For example, when the photosensitive element is disposed at the second opening 22, it may ensure that partial light may reach the surface of the second opening 22 to realize the photosensitive function. If the second opening 22 is disposed with the light-emitting element, the light emitted by the light-emitting element may exit from the position corresponding to the first opening 21 to the outside of the display panel 100 through the overlapped region.

Figure 7:
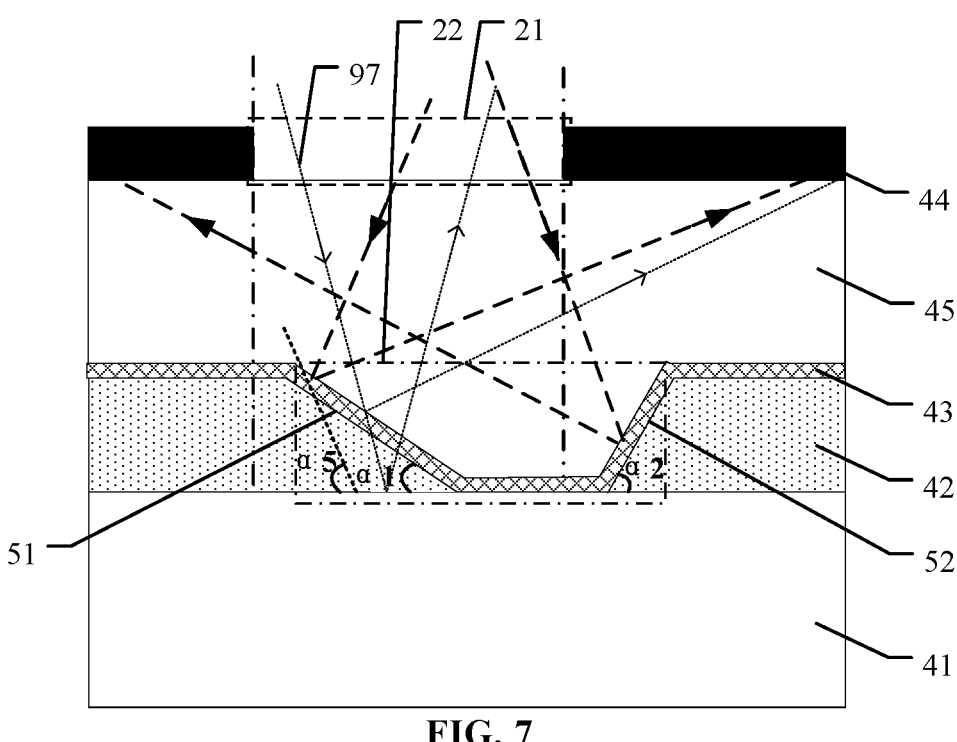
FIG. 7 illustrates another cross-sectional view along an AA' direction in FIG. 3 according to various embodiments of the present disclosure.
Figure 8:
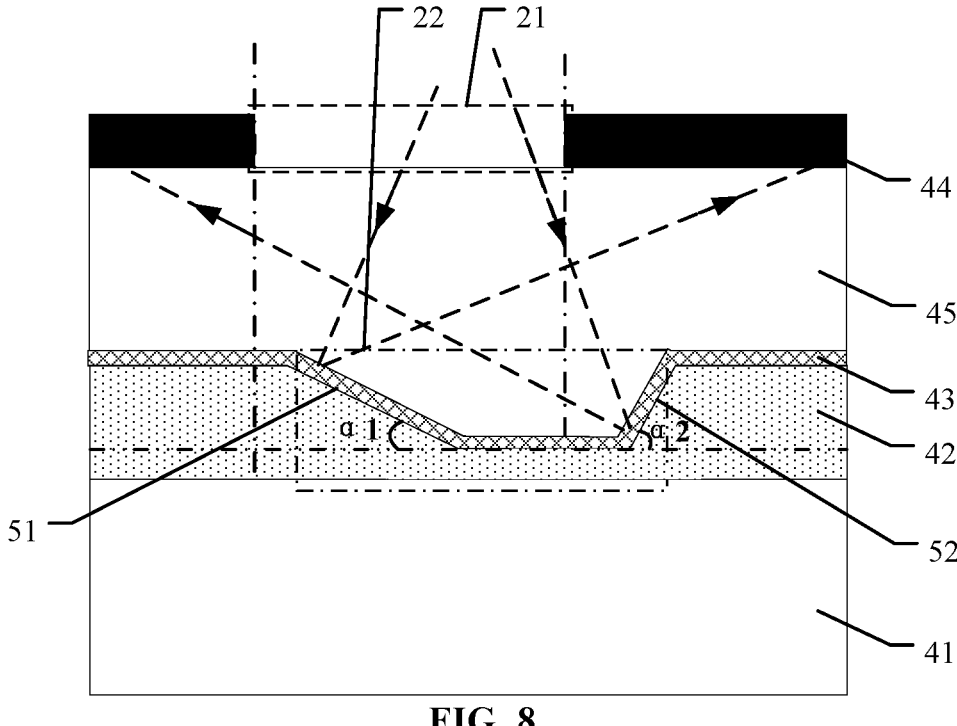
FIG. 8 illustrates another cross-sectional view along an AA' direction in FIG. 3 according to various embodiments of the present disclosure.

FIG. 7 illustrates another cross-sectional view along an AA' direction in FIG. 3 according to various embodiments of the present disclosure. FIG. 8 illustrates another cross-sectional view along an AA' direction in FIG. 3 according to various embodiments of the present disclosure. Referring to FIGS. 1, 3 7 and 8, optionally, the second opening 22 may include a first sidewall 51 and a second sidewall 52. The first sidewall 51 and the bottom surface of the first insulating layer 42 may form a first angle $\alpha 1$; and the second sidewall 52 and the bottom surface of the first insulating layer 42 may form a second angle $\alpha 2$. The first angle $\alpha 1$ and the second angle $\alpha 2$ may be both acute angles, and the first angle $\alpha 1$ may be less than the second angle $\alpha 2$.

For example, the second opening 22 provided in the present disclosure may include the first sidewall 51 and the second sidewall 52. Since the second opening 22 is formed by removing at least a part of the first insulating layer 42, the first sidewall 51 and the second sidewall 52 may be both formed by the first insulating layer 42.

As shown in FIG. 7, when the second opening 22 is formed by passing through the first insulating layer 42, the first angle $\alpha 1$ may be formed between the first sidewall 51 and the bottom surface of the first insulating layer 42, and the second angle $\alpha 2$ may be formed between the second sidewall 52 and the bottom surface of the first insulating layer 42. The present disclosure provides an optional embodiment as follows. The first angle $\alpha 1$ and the second angle $\alpha 2$ may be both acute angles, and the degrees of the first angle $\alpha 1$ and the second angle $\alpha 2$ may be set to be different, such that the degree of inclination of the first sidewall 51 and the degree of inclination of the second sidewall 52 may be different.

Or as shown in FIG. 8, when the second opening 22 does not pass through the first insulating layer 42 but is formed by removing a part of the thickness of the first insulating layer 42, the first angle $\alpha 1$ may be formed between the plane where the first sidewall 51 is located and the plane where the bottom surface of the first insulating layer 42 is located. The first angle $\alpha 1$ mentioned here refers to the angle at the side of the first sidewall 51 facing the inside of the first insulating layer 42. The second angle $\alpha 2$ may be formed between the plane where the second sidewall 52 is located and the plane where the bottom surface of the first insulating layer 42 is located. The second angle $\alpha2$ mentioned here refers to the angle at the side of the second sidewall 52 facing the inside of the first insulating layer 42. The present disclosure provides an optional embodiment as follows. The first angle $\alpha1$ and the second angle $\alpha2$ may be both acute angles, and the degrees of the first angle $\alpha1$ and the second angle $\alpha2$ may be set to be different, such that the degree of inclination of the first sidewall 51 and the degree of inclination of the second sidewall 52 may be different.

It should be noted that, in the embodiment shown in FIG. 7, when being viewed along the direction perpendicular to the drawing sheet of the present disclosure, the second opening 22 may be configured to be deviated to the right side of the first opening 21 relative to the disposing position of the first opening 21. After the incident light 97 shown in the drawings reaches the surface of the first electrode layer 43, the light may be reflected to the side of the light-blocking layer 44 by the first electrode layer 43 on the surface of the first sidewall 51 with the inclination angle $\alpha1$, so that the reflected light may be absorbed by the light-blocking layer 44. However, if the inclination angles $\alpha5$ and $\alpha2$ of the first sidewall are same, as shown in FIG. 7, the incident light 97 may reach the surface of the first electrode layer which is a horizontal plane and may be reflected by the first electrode layer to the first opening 21 to exit. Therefore, in the present disclosure, the degree of inclination of the first sidewall 51 and the degree of inclination of the second sidewall 52 may be different, so that a part of light irradiated on the first sidewall 51 and/or the second sidewall 52 through the first opening 21 may be more reflected to the side of the light-blocking layer 44, instead of being reflected to the first opening 21 to exit. In such way, the incident light may be reflected in a specific direction by the first electrode layer 43 through the inclined surface with a specific inclination angle, and customized direction of the reflection of the ambient light may be realized. Therefore, the number of light rays exiting from the first opening 21 after being reflected by the first electrode layer 43 may be reduced, and the influence of the reflected light rays on the display effect of the display panel 100 may be weakened, which may be beneficial for improving the display uniformity of the display panel 100 and further improving the user experience.

In addition, if the incident angle of the light is similar to the complementary angle of $\alpha5$ in the drawings, and if the degrees of the first angle $\alpha5$ and the second angle $\alpha2$ is set to be same, that is, if the degrees of inclination of the first sidewall and the second angle are set to be same, the incident light may be reflected by the first electrode layer on the surface of the first sidewall to the first electrode layer on the surface of the second sidewall when the incident light reaches the first sidewall. The degrees of inclination of the first sidewall and the second sidewall are same, the incident light irradiated on the first sidewall and the exiting light reflected by the electrode layer on the surface of the second sidewall may have symmetrical optical paths. Therefore, the incident light exiting from the first opening may be reflected again by the electrode layer on the surface of the second sidewall to a same position of the first opening to exit. Based on above-mentioned reasons, in the present disclosure, the degrees of inclination of the first sidewall 51 and the second sidewall 52 may be set to be different. When the incident angle and the complementary angle of the first angle are similar, the light irradiated to the first electrode layer 43 on the surface of the first sidewall 51 may be reflected by the first electrode layer 43 on the surface of the first sidewall 51 and then reach the first electrode layer 43 on the surface of the second sidewall 52; after being reflected again by the first electrode layer 43 on the surface of the second sidewall 52, the reflected light may be blocked and absorbed by the light-blocking layer 44, so that the reflected light may not exit from the first opening 21. For example, since the present disclosure sets the degrees of inclination of the first sidewall 51 and the second sidewall 52 to be different, the path direction of the light incident to the first electrode layer 43 on the surface of the first sidewall 51 through the first opening 21 may be not symmetric with the path direction of the light of the exiting light reflected again after being reflected by the first electrode layer 43 on the surface of the first sidewall 51 to the first electrode layer 43 on the surface of the second sidewall 52. Therefore, the exiting light may not exit from the first opening 21 but exit to the surface of the light-blocking layer 44 to be absorbed, which may reduce the amount of light exiting from the first opening 21 after secondary reflection and may be beneficial for reducing the reflectivity of the display panel.

Figure 9:
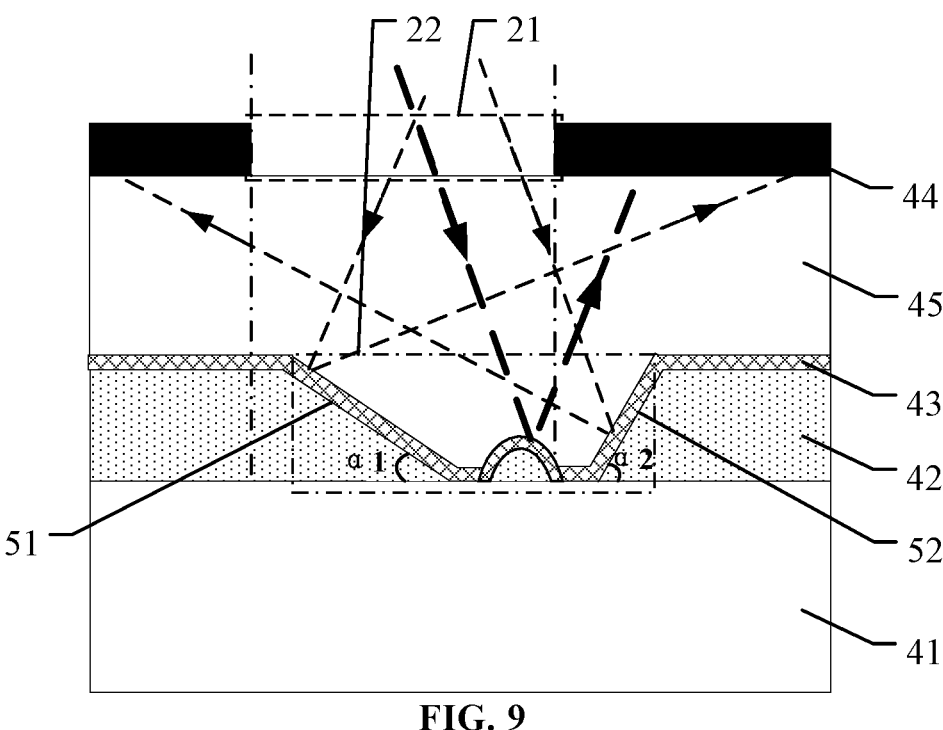
FIG. 9 illustrates another cross-sectional view along an AA' direction in FIG. 3 according to various embodiments of the present disclosure.
Figure 10:
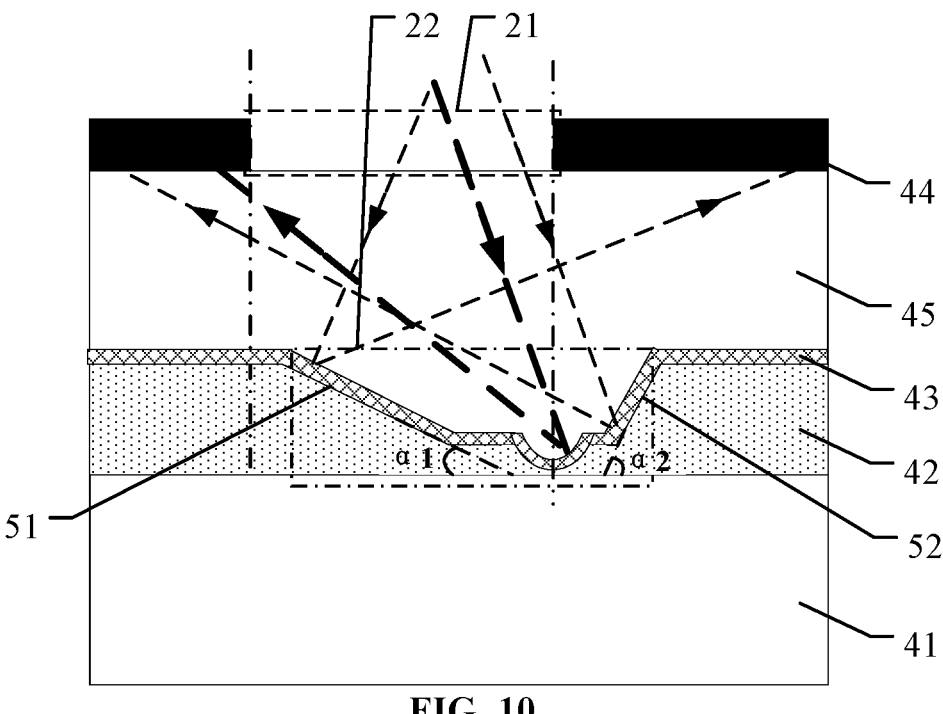
FIG. 10 illustrates another cross-sectional view along an AA' direction in FIG. 3 according to various embodiments of the present disclosure.

FIG. 9 illustrates another cross-sectional view along the AA' direction in FIG. 3 according to various embodiments of the present disclosure. FIG. 10 illustrates another cross-sectional view along the AA' direction in FIG. 3 according to various embodiments of the present disclosure. Referring to FIGS. 1, 3, 9 and 10, optionally, at a position corresponding to the second opening 22, a surface at the side of the first electrode layer 43 facing away from the substrate 41 may at lease include a curved surface.

For example, the present disclosure also provides an optional configuration manner as the following. The surface at the side of the first electrode layer 43 which is at the position corresponding to the second opening 22 and faces away from the substrate 41 may include the curved surface. The first electrode layer 43 with the curved surface structure may realize specific reflection of the incident light through the first opening 21, so that the incident light may be reflected in a specific direction through the specific curved surface to realize the reflection of the ambient light in a customized direction. Therefore, the number of light rays exiting from the first opening 21 after being reflected by the first electrode layer 43 may be reduced, and the influence of the reflected light rays on the display effect of the display panel 100 may be weakened, which may be beneficial for improving the display uniformity of the display panel 100 and further improving the user experience.

It should be noted that the present disclosure may not limit the number of curved surfaces included in the first electrode layer 43 at the position corresponding to the second opening 22. For example, one second opening 22 may be correspondingly disposed with one curved surface, two curved surfaces, or even more curved surfaces. The present disclosure may not limit the number of the curved surfaces corresponding to the second opening 22, and the user may make corresponding selections according to requirements. In addition, the present disclosure may not limit the degree of curvature of the curved surface and the convex direction of the curved surface. Any curved surface may be formed by protruding toward the side of the substrate 41 (as shown in FIG. 10) or may be formed by protruding toward the side of the light-blocking layer 44 (as shown in FIG. 9). That is, the curved surface disposed in the first electrode layer 43 at the position corresponding to the second opening 22 in the present disclosure may be a convex curved surface, a concave curved surface, or both a convex curved surface and a concave curved surface (a convex and concave surface), which may not be limited according to embodiments of the present disclosure.

Figure 11:
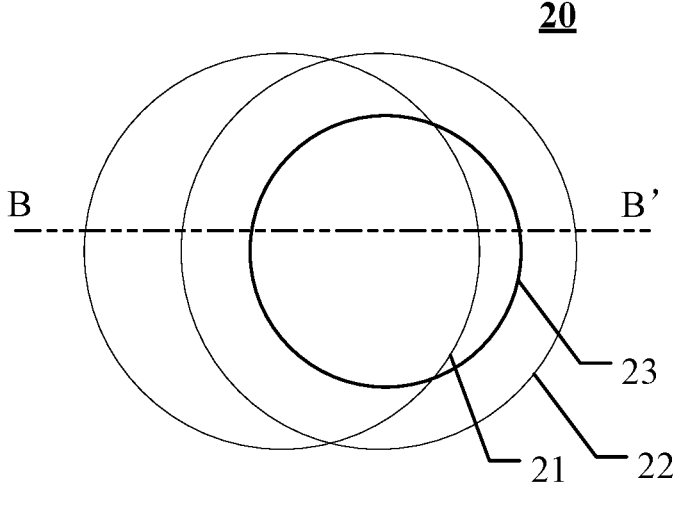
FIG. 11 illustrates another perspective view of an opening combination in FIG. 1 according to various embodiments of the present disclosure.
Figure 12:
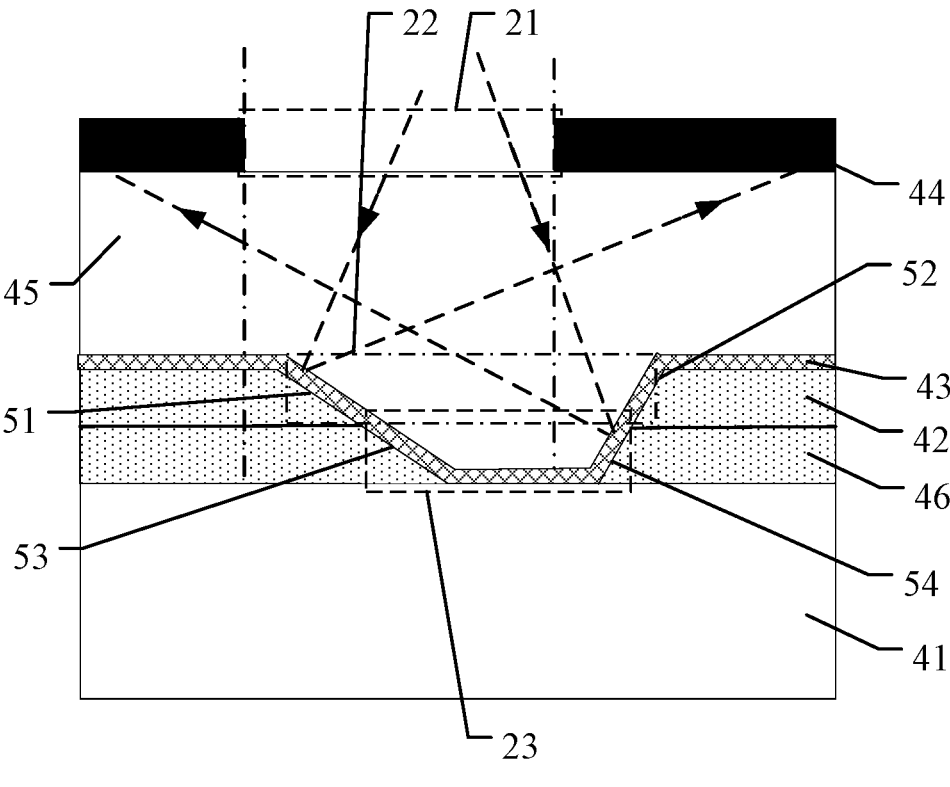
FIG. 12 illustrates a cross-sectional view along a BB' direction in FIG. 11 according to various embodiments of the present disclosure.
Figure 13:
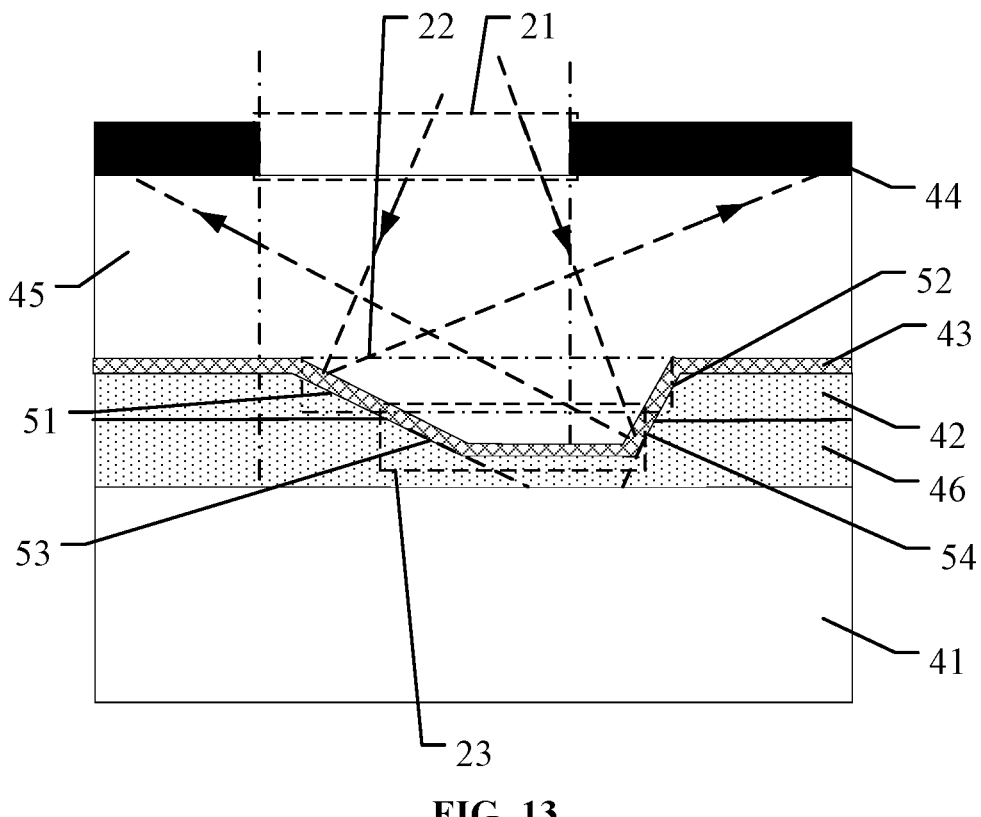
FIG. 13 illustrates another cross-sectional view along a BB' direction in FIG. 11 according to various embodiments of the present disclosure.
Figures 14, 15:
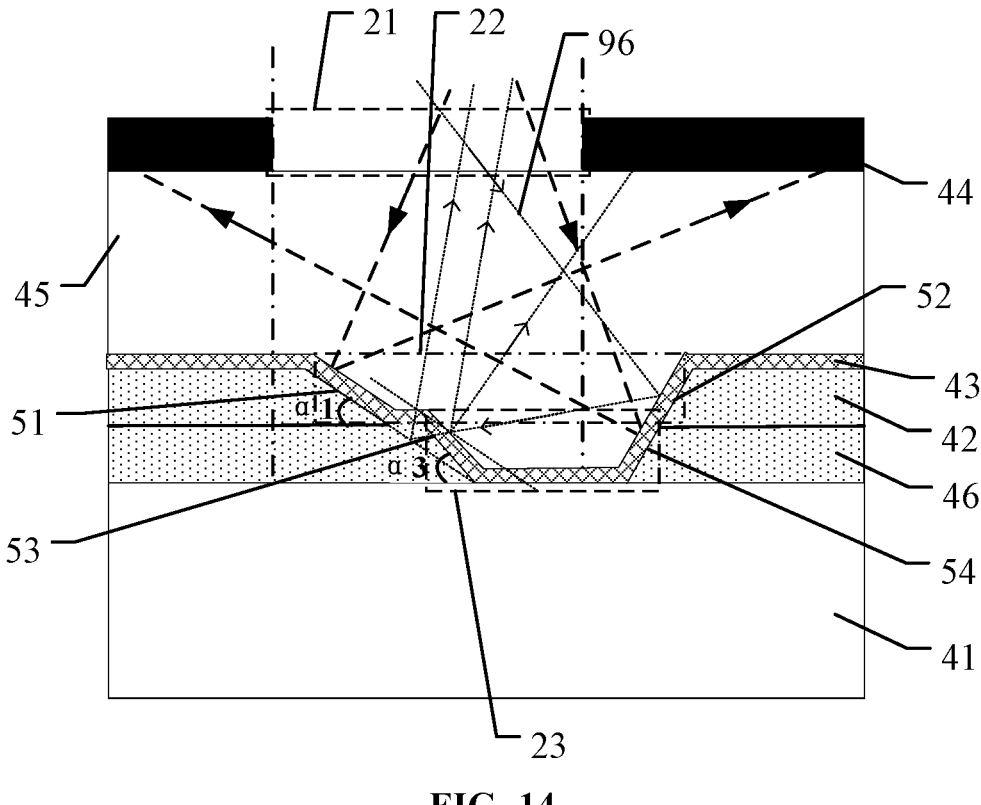
FIG. 14 illustrates another cross-sectional view along a BB' direction in FIG. 11 according to various embodiments of the present disclosure.
FIG. 15 illustrates another perspective view of an opening combination in FIG. 1 according to various embodiments of the present disclosure.

FIG. 11 illustrates another perspective view of an opening combination in FIG. 1 according to various embodiments of the present disclosure. FIG. 12 illustrates a cross-sectional view along a BB' direction in FIG. 11 according to various embodiments of the present disclosure. FIG. 13 illustrates another cross-sectional view along the BB' direction in FIG. 11 according to various embodiments of the present disclosure. FIG. 14 illustrates another cross-sectional view along the BB' direction in FIG. 11 according to various embodiments of the present disclosure. Referring to FIGS. 1, 3, and 11-14, optionally, a second insulating layer 46 may also be included. The second insulating layer 46 may be on the side of the first insulating layer 42 adjacent to the substrate 41.

The opening combination 20 may further include a third opening 23. The second opening 22 may pass through the first insulating layer 42; the third opening 23 may pass through at least a part of the second insulating layer 46; and the second opening 22 and the third opening 23 may be connected with each other.

The diameter of the second opening 22 may be different from that of the third opening 23, and at least one sidewall of the second opening 22 may be continuous with at least one sidewall of the third opening 23.

For example, the present disclosure provides an optional embodiment that the display panel 100 may include two insulating layers. For example, on the basis of including the first insulating layer 42 in the display panel 100, the second insulating layer 46 may be further included. The second insulating layer 46 here may be disposed on the side of the first insulating layer 42 adjacent to the substrate 41. On the basis of such structure, the present disclosure may further configure that the opening combination 20 may include the third opening 23 in addition to the first opening 21 and the second opening 22. At this point, the second opening 22 may be configured to be formed through the first insulating layer 42, and the third opening 23 may be configured to be formed through entire second insulating layer 46 (as shown in FIG. 11); or the third opening 23 may be configured to be formed by removing a part of the second insulating layer 46 from the surface of the second insulating layer 46, on the side away from the substrate 41, toward the side of the substrate 41 (as shown in FIG. 12), and the second opening 22 and the third opening 23 may be connected with each other.

At this point, the first electrode layer 43 may be formed inside the second opening 22 and the third opening 23 toward the inside of the opening. That is, embodiments shown in FIGS. 12-14 are for the display panel 100 including two adjacent insulating layers (the first insulating layer 42 and the second insulating layer 46). Compared to the configuration in previous embodiments including only one insulating layer (the first insulating layer 42), it may realize the configuration of the non-planar first electrode layer 43 in entire insulating layer (the first insulating layer 42 and the second insulating layer 46) and realize the non-symmetric design of the first opening 21 and openings in the insulating layer (the second opening 22 and the third opening 23). For example, the first electrode layer 43 formed herein may have multiple inclined surfaces relative to the plane of the substrate 41. The specific reflection of light incident through the first opening 21 may be realized by the first electrode layer 43 having the inclined surfaces. Similar to the principle shown in previous schematic diagram in FIG. 4, compared with the first electrode layer of the planar structure, the first electrode layer 43 of the non-planar structure may reflect more incident light to the side surface of the light-blocking layer 44 adjacent to the substrate 41 to be absorbed by the light-blocking layer 44. Therefore, the number of reflected light rays incident to the first electrode layer 43 and exiting from the first opening 21 may be reduced. That is, by disposing the first electrode layer 43 with a non-planar structure, a part of the light may be reflected to the light-blocking layer 44 to be absorbed. In addition, the opening combination 20 shown in FIG. 12-FIG. 14 may also be designed to be asymmetric, which is same as the principle of the schematic diagram shown in FIG. 5 above. A part of the light that would have been reflected by the first electrode layer (multiple times) and then exited from the first opening 21 may be adjusted to be reflected by the first electrode layer 43 to the side surface of the light-blocking layer 44 adjacent to the substrate 41 and absorbed by the light-blocking layer 44. It is equivalent to that the incident light may be reflected in a specific direction through the first electrode layer 43 of the non-planar structure and/or the asymmetrically designed opening combination 20, thereby realizing the reflection of the customized direction of the ambient light. Therefore, the number of light rays exiting from the first opening 21 after being reflected by the first electrode layer 43 may be reduced, and the influence of the reflected light rays on the display effect of the display panel 100 may be weakened, which may be beneficial for improving the display uniformity of the display panel 100 and further improving the user experience.

Furthermore, the present disclosure may also provide an optional embodiment that the diameter of the second opening 22 and the diameter of the third opening 23 may be different. For example, when the orthographic projection of the second opening 22 on the plane of the substrate 41 and the orthographic projection of the third opening 23 on the plane of the substrate 41 are circles, the diameter of the second opening 22 and the diameter of the third opening 23 may be different. Meanwhile, at least a part of the sidewall of the second opening 22 and a part of the sidewall of the third opening 23 may be smoothly connected (as shown in FIG. 12 and FIG. 13); and there may be a part of the sidewall of the second opening 22 which may be not connected with a part of the sidewall of the third opening 23 at corresponding position (as shown in FIG. 14). Such configuration may increase the area of the sidewall, so that the light incident through the first opening 21 may be more irradiated on the side surfaces. Therefore, more light may be specifically reflected by the first electrode layer 43 at positions of the side surfaces, the incident light may be reflected in a specific direction through a specific slope, more incident light may be reflected and absorbed by the light-blocking layer 44, and the number of reflected light rays exiting from the first opening 21 may be reduced. That is, the reflection of the customized direction of the ambient light may be realized, the number of light rays exiting from the first opening 21 after being reflected by the first electrode layer 43 may be reduced, the influence of the reflected light rays on the display effect of the display panel 100 may be weakened, and the display uniformity of the display panel 100 may be improved.

It should be noted that, referring to FIG. 2, the first insulating layer 42 and the second insulating layer 46 shown in FIGS. 12-14 of the present disclosure may be equivalent to the first sub-insulating layer 424 and the second sub-insulating layer 423 in FIG. 2.

It should also be noted that, as shown in FIG. 14, when the diameters of the second opening 22 and the third opening 23 are different in the present disclosure, and if it is ensured that sidewalls of the second opening 22 and the third opening 23 at one side (such as the second sidewall 52 and the fourth sidewall 54 in the drawing) are continuous smooth surfaces during the manufacturing process, it may result in that the surface on the opposite side of the smooth surface may inevitably be a stepped surface; and the size of the angle between the sidewall of the second opening 22 and the sidewall of the third opening 23 facing the inner side of the insulating layer corresponding to the stepped surface may be different from the size of the angle of the sidewall corresponding to the smooth surface facing the inner side of the insulating layer. That is, it may realize that two sidewalls formed by the second opening 22 and the third opening 23 (sidewalls at one side are the second sidewall 52 and the fourth sidewall 54, and sidewalls at another side are the first sidewall 51 and the third sidewall 53) may have different degrees of inclination. As mentioned above, the present disclosure may configure that the degree of inclination of the second sidewall 52 and the fourth sidewall 54 at one side may be different from the inclination of the first sidewall 51 and the third sidewall 53 at the opposite side of the opening. The path direction of the light incident to the first electrode layer 43 on the surface of the first sidewall 51 and/or the third sidewall 53 through the first opening 21 may be asymmetric with the path direction of the exiting light reflected by the second sidewall 52 and/or the first electrode layer 43 on the surface of the fourth sidewall 54 and then re-reflected. Therefore, the exiting light may not exit from the first opening 21 but exit to the surface of the light-blocking layer 44 to be absorbed, which may reduce the amount of light exiting from the first opening 21 after secondary reflection and may be beneficial for reducing the reflectivity of the display panel.

Referring to FIGS. 1, 3 and 14, optionally, the second opening 22 may include the first sidewall 51 and the second sidewall 52; the third opening 23 may include the third sidewall 53 and the fourth sidewall 54; the orthographic projection of the fourth sidewall 54 on the plane of the substrate 41 may be at least partially overlapped with the orthographic projection of the second sidewall 52 on the plane of the substrate 41; and the orthographic projection of the third sidewall 53 on the plane of the substrate 41 may be within the orthographic projection of the second opening 22 on the plane of the substrate 41.

For example, the present disclosure also provides an optional configuration manner as the following. The display panel 100 may include the first insulating layer 42 and the second insulating layer 46; the display panel 100 may include the second opening 22 and the third opening 23 which are correspondingly disposed; the second opening 22 may be formed by passing through the first insulating layer 42; the third opening 23 may be formed by passing through entire second insulating layer 46; or the third opening 23 may be formed by removing a part of the second insulating layer 46 from the surface of the second insulating layer 46, on the side away from the substrate 41, toward the side of the substrate 41, and the second opening 22 and the third opening 23 may be connected with each other. If the second opening 22 includes the first sidewall 51 and the second sidewall 52, the third opening 23 may include the third sidewall 53 and the fourth sidewall 54 correspondingly. At this point, the orthographic projection of the fourth sidewall 54 on the plane of the substrate 41 may be at least partially overlapped with the orthographic projection of the second sidewall 52 on the plane of the substrate 41; and the orthographic projection of the third sidewall 53 on the plane of the substrate 41 may be within the orthographic projection of the second opening 22 on the plane of the substrate 41, which is equivalent to that at the side where the second sidewall 52 and the fourth sidewall 54 are configured, the opening inside space of the second opening 22 at the side away from the inside of the opening (e.g., away from the substrate 41) may be greater than the opening inside space of the third opening 23 at the side away from the inside of the opening (e.g., away from the substrate 41).

The first electrode layer 43 may be configured to be formed at the second opening 22 and the third opening 23 toward inside of the opening in above-mentioned structure. The first electrode layer 43 may include an inclined surface relative to the plane of the substrate 41. The specific reflection of the incident light through the first opening 21 may be realized by the first electrode layer 43 with a larger inclined surface, a part of the light may be reflected to the light-blocking layer 44 to be absorbed by the light-blocking layer 44. In such way, the incident light may be reflected in a specific direction through the first electrode layer 43 of a specific structure, thereby realizing the customized direction reflection of the ambient light. Therefore, the number of light rays exiting from the first opening 21 after being reflected by the first electrode layer 43 may be reduced, and the influence of the reflected light rays on the display effect of the display panel 100 may be weakened, which may be beneficial for improving the display uniformity of the display panel 100 and further improving the user experience.

Furthermore, in the present disclosure, the second opening 22 and the third opening 23 may be connected with each other, so that the non-planar structure of the first electrode layer 43 at this position may be realized. Using a same principle shown in FIG. 4, compared with the first electrode layer with a planar structure, the first electrode layer 43 with a non-planar structure may reflect more incident light to the side surface of the light-blocking layer 44 adjacent to the substrate 41 to be absorbed by the light-blocking layer 44. Therefore, the number of reflected light rays exiting from the first opening 21 by the light incident on the first electrode layer 43 may be reduced. Furthermore, the orthographic projection of the third sidewall 43 on the plane of the substrate 41 may be within the orthographic projection of the second opening 22 on the plane of the substrate 41, which is equivalent to configure that the first sidewall 51 and the third sidewall 53 may be non-smoothly connected. That is, as shown in FIG. 14, the third sidewall 53 may be not in the extending direction of the first sidewall 51. The incident light 96 shown in FIG. 14 may be reflected to the first electrode layer 43 on the surface of the third sidewall 53 after exiting the first electrode layer 43 on the surface of the second sidewall 52, and then be re-reflected to the light-blocking layer 44 to be absorbed by the light-blocking layer 44. If the third sidewall is disposed along the extending direction of the first sidewall, as shown in FIG. 14, the incident light 96 may be reflected to the first electrode layer on the extended surface of the first sidewall after exiting the first electrode layer on the second sidewall surface, and then be reflected by the first electrode layer to the first opening 21 to exit. Obviously, in the present disclosure, by disposing the third sidewall 53 not in the extending direction of the first sidewall 51, a part of the incident light may be reflected to the surface of the light-blocking layer 44 to be absorbed instead of being reflected to the first opening 21 to exit. Therefore, the number of light rays exiting from the first opening 21 after being reflected by the first electrode layer 43 may be reduced, and the influence of the reflected light rays on the display effect of the display panel 100 may be weakened.

Referring to FIGS. 1, 3 and 14, optionally, the first sidewall 51 and the bottom surface of the first insulating layer 42 may form the first angle $\alpha 1$; the third sidewall 53 and the bottom surface of the second insulating layer 46 may form the third angle α3; the first angle α1 and the third angle α3 may be both acute angles; and the sizes of the first angle α1 and the third angle α3 may be different.

For example, the present disclosure also provides an optional configuration manner as the following. The display panel 100 may include the first insulating layer 42 and the second insulating layer 46; the display panel 100 may include the second opening 22 and the third opening 23 which are correspondingly disposed; the second opening 22 may be formed by passing through the first insulating layer 42; the third opening 23 may be formed by passing through entire second insulating layer 46; or the third opening 23 may be formed by removing a part of the second insulating layer 46 from the surface of the second insulating layer 46, on the side away from the substrate 41, toward the side of the substrate 41, and the second opening 22 and the third opening 23 may be connected with each other. If the second opening 22 includes the first sidewall 51 and the second sidewall 52, the third opening 23 may include the third sidewall 53 and the fourth sidewall 54 correspondingly. The first angle α1 may be formed between the plane where the first sidewall 51 is located and the bottom surface of the first insulating layer 42; and the third angle α3 may be formed between the plane where the third sidewall 53 is located and the plane where the bottom surface of the second insulating layer 46 is located. In the present disclosure, the first angle α1 and the third angle α3 may be set to be acute angles. In such case, the size of the first angle α1 and the third angle α3 may be set to be same, or the size of the first angle α1 and the third angle α3 may be set to be different, which may not be limited in present disclosure.

The first electrode layer 43 may be configured to be formed at the second opening 22 and the third opening 23 toward inside of the opening in above-mentioned structure. The first electrode layer 43 may include an inclined surface relative to the plane of the substrate 41. The specific reflection of the incident light through the first opening 21 may be realized by the first electrode layer 43 with a larger inclined surface, a part of the light may be reflected to the light-blocking layer 44 to be absorbed by the light-blocking layer 44. In such way, the incident light may be reflected in a specific direction through the first electrode layer 43 of a specific structure, thereby realizing the customized direction reflection of the ambient light. Therefore, the number of light rays exiting from the first opening 21 after being reflected by the first electrode layer 43 may be reduced, and the influence of the reflected light rays on the display effect of the display panel 100 may be weakened, which may be beneficial for improving the display uniformity of the display panel 100 and further improving the user experience.

Furthermore, if the size of the first angle α1 and the third angle α3 are set to be same, as shown in FIG. 14, the incident light 96 may be reflected to the first electrode layer on the extended surface of the third sidewall after exiting the first electrode layer on the surface of the second sidewall, and then be reflected by the first electrode layer to the first opening to exit. However, when the first angle α1 is set to be smaller than the third angle α3 in present disclosure, as shown in FIG. 14, the incident light 96 may be reflected to the first electrode layer 43 on the surface of the third sidewall 53 after exiting the first electrode layer 43 on the surface of the second sidewall 52 and then be re-reflected by the light-blocking layer 44 to be absorbed. Obviously, in the present disclosure, by configuring the extension directions of the third sidewall 53 and the first sidewall 51 to be different, that is, configuring the sizes of the first angle α1 and the third angle α3 to be different, a part of the incident light may be reflected to the surface of the light-blocking layer 44 to be absorbed instead of being reflected to the first opening 21 to exit. Therefore, the number of light rays exiting from the first opening 21 after being reflected by the first electrode layer 43 may be reduced, and the influence of the reflected light rays on the display effect of the display panel 100 may be weakened.

In addition, when the first sidewall 51 and the third sidewall 53 are arranged in a stepped arrangement as shown in FIG. 14, the second sidewall 52 and the fourth sidewall 54 may also be arranged in a same stepped arrangement as the first sidewall 51 and the third sidewall 53. The fabrication process of the stepped second openings 22 and the third openings 23 may be easier to achieve, which may be beneficial for reducing the difficulty of the process of forming the non-planar first electrode layer 43.

Figure 16:
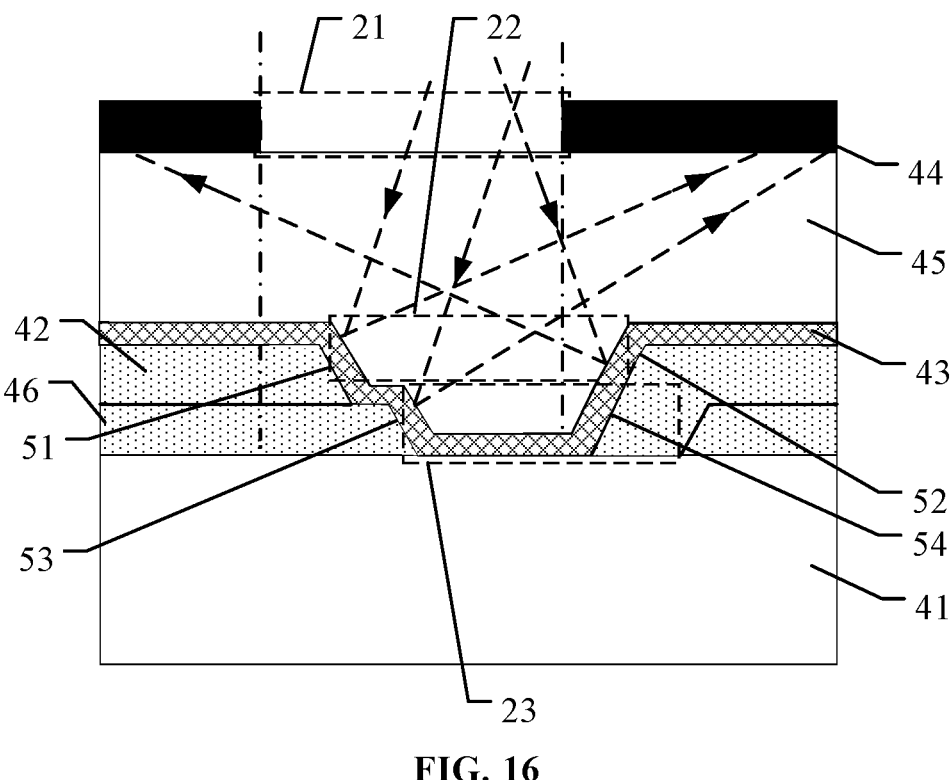
FIG. 16 illustrates a cross-sectional view along a DD' direction in FIG. 15 according to various embodiments of the present disclosure.

FIG. 15 illustrates another perspective view of an opening combination in FIG. 1 according to various embodiments of the present disclosure. FIG. 16 illustrates a cross-sectional view along a DD' direction in FIG. 15 according to various embodiments of the present disclosure. Referring to FIGS. 1, 15 and 16, in addition to the arrangement manner of the second opening 22 and the third opening 23 provided in above-mentioned FIGS. 12-14, the second opening 22 and the third opening 23 may also be arranged as shown in one embodiment shown in FIG. 16. In one embodiment shown in FIG. 16, the diameters of the first opening 21, the second opening 22, and the third opening 33 may be same. For example, when the orthographic projections of the first opening 21, the second opening 22 and the third opening 33 on the plane of the substrate 41 are all circles, the diameters of the orthographic projections of the first opening 21, the second opening 22 and the third opening 33 on the plane of the substrate 41 may be same. At this point, when the opening combination 20 is asymmetrically designed, the first opening 21, the second opening 22 and the third opening 33 may be all arranged to be staggered with each other. As shown in FIG. 16, when being viewed along the direction perpendicular to the drawing sheet of the present disclosure, the center point of the second opening 22 may be at the right side of the center point of the first opening 21, and the center point of the third opening 33 may be at the right side of the center point of the second opening 22. In such way, the first electrode layer 43 of a non-planar structure, which may be formed by the surface of the first sidewall 51, the surface of the second sidewall 52, the surface of the third sidewall 53, the surface of the fourth sidewall 54, and the surface between the third sidewall 53 and the fourth sidewall 54, may reflect some incident light multiple times. The intensity of the light after multiple reflections may become weaker, and even if the reflected light still exits from the first opening 21 finally, the influence of the reflected light on the display effect of the display panel 100 may be reduced to a certain extent. Furthermore, the light after multiple reflections may also be reflected to the surface of the light-blocking layer 44 to be absorbed, thereby reducing the number of light rays exiting from the first opening 21, which may be beneficial for reducing the influence of reflected light rays on the display effect of the display panel 100. That is, compared with the incident light being reflected by the first electrode layer and directly exiting from the first opening again, the embodiment shown in FIG. 16 of the present disclosure may be beneficial for reducing the amount of reflected light re-exiting from the first opening 21 and for reducing the light intensity of a part of the reflected light re-exiting from the first opening 21, thereby achieving the technical effect of reducing the reflectivity of the display panel 100.

In addition, in one embodiment shown in FIG. 16, the third opening 23 may be formed through the second insulating layer 46. However, when the first insulating layer 42 is further fabricated, the first insulating layer 42 may fill a part of the third opening 23. That is, for the sidewalls of continuous opening of the second opening 22 and the third opening 33 finally formed, one side (the first sidewall 51 and the third sidewall 53) may be formed by the first insulating layer 42 and the second insulating layer 46; and the other side (the second sidewall 52 and the fourth sidewall 54) may be formed by the first insulating layer 42. This may result in that the third opening and the second opening 22, which are finally formed, may be unequal in size, so that same technical effect as one embodiment shown in FIG. 14 may be achieved. That is, the sidewalls on two sides formed by the second opening 22 and the third opening 23 (sidewalls at one side may be the second sidewall 52 and the fourth sidewall 54, and sidewalls at another side may be the first sidewall 51 and the third sidewall 53) may have different degrees of inclination. As mentioned above, in the present disclosure, the degrees of inclination of the second sidewall 52 and the fourth sidewall 54 may be different from the degrees of inclination of the first sidewall 51 and the third sidewall 53 on the opposite side of the opening. The path direction of the light incident to the first electrode layer 43 on the surface of the first sidewall 51 and/or the third sidewall 53 through the first opening 21 may be not symmetric with the path direction of the exiting light, which is re-reflected, after being reflected by the first electrode layer 43 on the surface of the second sidewall 52 and/or the fourth sidewall 54. Therefore, the exiting light may not exit from the first opening 21 but exit to the surface of the light-blocking layer 44 to be absorbed, which may reduce the amount of light exiting from the first opening 21 after secondary reflection, which may be beneficial for reducing the reflectivity of the display panel.

It should be noted that when the third opening 23 is formed in the second insulating layer 46 and the second opening 22 is formed in the first insulating layer 42, the diameter of the third opening 23 may be prepared to be same as the diameter of the second opening 22. Such configuration may avoid smooth sidewall transition at one side.

Furthermore, in one embodiment provided by the present disclosure, the second opening 22 and the third opening 23 may be staggered with each other to achieve desired technical effect, which may avoid the problem that the second opening 22 and the third opening 23 need to be aligned in the process and simplify the process difficulty of the second opening 22 and the third opening 23 to a certain extent, thereby being beneficial for improving the manufacturing efficiency of the display panel 100.

Figure 17:
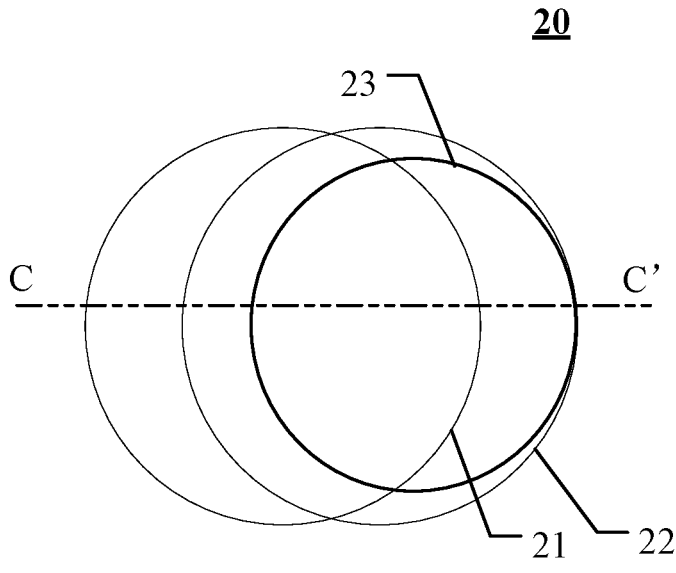
FIG. 17 illustrates another perspective view of an opening combination in FIG. 1 according to various embodiments of the present disclosure.
Figure 18:
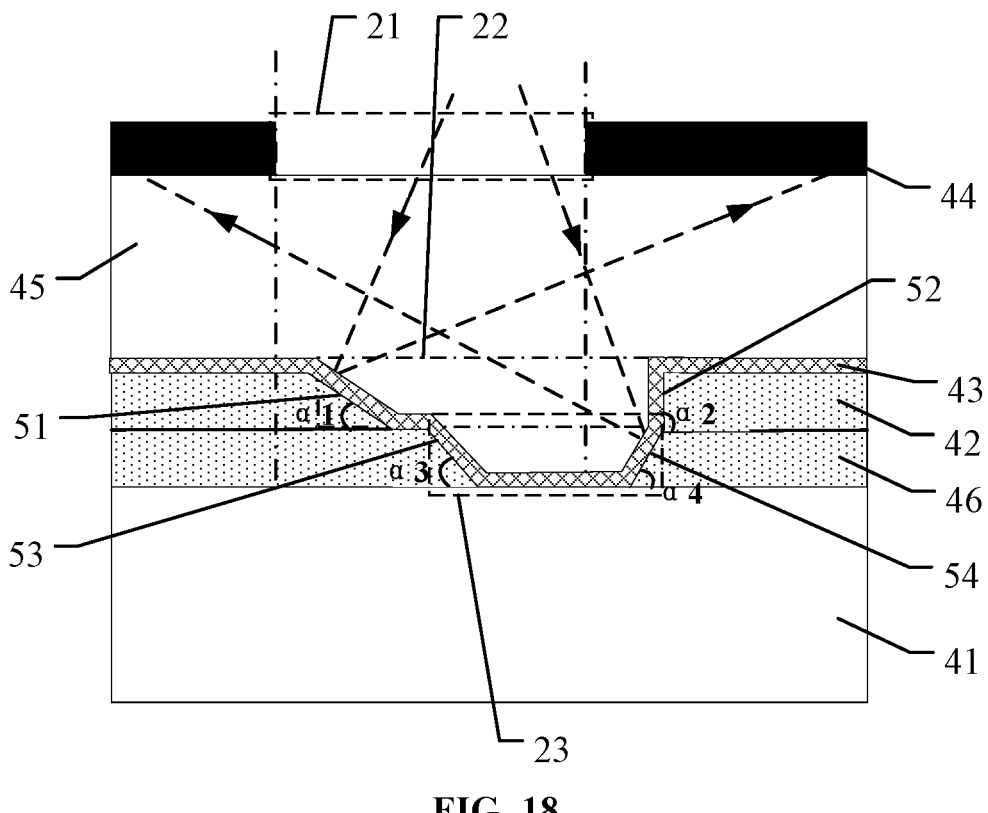
FIG. 18 illustrates a cross-sectional view along a CC' direction in FIG. 17 according to various embodiments of the present disclosure.

FIG. 17 illustrates another perspective view of an opening combination in FIG. 1 according to various embodiments of the present disclosure. FIG. 18 illustrates a cross-sectional view along a CC' direction in FIG. 17 according to various embodiments of the present disclosure. Referring to FIGS. 1, 3, and 14-18, optionally, the second insulating layer 46 may be further included. The second insulating layer 46 may be on the side of the first insulating layer 42 adjacent to the substrate 41.

The opening combination 20 may further include the third opening 23. The second opening 22 may pass through the first insulating layer 42, the third opening 23 may pass through at least part of the second insulating layer 46, and the second opening 22 may be connected to the third opening 23.

The diameter of the second opening 22 may be different from the diameter of the third opening 23.

At least a part of the sidewall of the second opening 22 and at least part of the sidewall of the third opening 23 may have different degrees of inclination relative to the substrate 41.

For example, the present disclosure provides an optional embodiment that the display panel 100 may include two insulating layers. For example, on the basis of including the first insulating layer 42 in the display panel 100, the second insulating layer 46 may be further included. The second insulating layer 46 herein may be disposed on the side of the first insulating layer 42 adjacent to the substrate 41. On the basis of such structure, the present disclosure may further configure that the opening combination 20 may include the third opening 23 in addition to the first opening 21 and the second opening 22. At this point, the second opening 22 may be formed through the first insulating layer 42, the third opening 23 may be formed through entire second insulating layer 46; or the third opening 23 may be formed by removing a part of the second insulating layer 46 from the surface of the second insulating layer 46, on the side away from the substrate 41, toward the side of the substrate 41, and the second opening 22 and the third opening 23 may be connected with each other.

At this point, the second opening 22 and the third opening 23 may be configured to have different diameters. For example, when the orthographic projections of the second opening 22 and the third opening 23 on the plane of the substrate 41 are both circles, the radii of the second opening 22 and the third opening 23 may be different. At this point, whether there are connecting sidewalls between the second opening 22 and the third opening 23 may not be limited. At this point, the sidewall of the second opening 22 may be configured to have a different degree of inclination from the sidewall of the third opening 23. That is, the angle between the plane of a certain part of the sidewall of the second opening 22 and the plane of the substrate 41 may be different from the angle between the plane of a part of sidewall, which corresponds to the third opening 23, and the plane of the substrate 41 (as shown in FIG. 18, the sizes of $\alpha1$ and $\alpha3$ may be different, and the sizes of $\alpha2$ and $\alpha4$ may be different). Obviously, the angles may also be configured to be same. In such structure, the first electrode layer 43 may be configured to be formed at the second opening 22 and the third opening 23 toward inside of the opening in above-mentioned structure. The first electrode layer 43 may include an inclined surface relative to the plane of the substrate 41. The specific reflection of the incident light through the first opening 21 may be realized by the first electrode layer 43 with a larger inclined surface, a part of the light may be reflected to the light-blocking layer 44 to be absorbed by the light-blocking layer 44. In such way, the incident light may be reflected in a specific direction through the first electrode layer 43 of a specific structure, thereby realizing the customized direction reflection of the ambient light. Therefore, the number of light rays exiting from the first opening 21 after being reflected by the first electrode layer 43 may be reduced, and the influence of the reflected light rays on the display effect of the display panel 100 may be weakened, which may be beneficial for improving the display uniformity of the display panel 100 and further improving the user experience.

In addition, the non-planar structure of the first electrode layer 43 in the present disclosure may have a variety of surfaces with different degrees of inclination and different inclination directions, such that the light incident through the first opening 21 may be reflected once or multiple times by the first electrode layer 43 of the non-planar structure. As mentioned above, the non-planar structure of the first electrode layer 43 may make a part of the incident light finally reflected to the light-blocking layer 44 to be absorbed or make the intensity of the light become weaker after a part of the light is reflected multiple times, which may both be beneficial for reducing the reflectivity of the display panel 100 and improving the display effect of the display panel 100.

Referring to FIGS. 11-18, optionally, the second insulating layer 46 may be further included; and the second insulating layer 46 may be on the side of the first insulating layer 42 adjacent to the substrate 41.

The opening combination 20 may further include the third opening 23, the second opening 22 may pass through the first insulating layer 42, and the third opening 23 may pass through at least part of the second insulating layer 46; and the second opening 22 may be connected to the third opening 23.

The orthographic projection of the third opening 23 on the plane of the substrate 41 may be within the orthographic projection of the second opening 22 on the plane of the substrate 41.

For example, the present disclosure provides an optional embodiment that the display panel 100 may include two insulating layers. On the basis of including the first insulating layer 42 in the display panel 100, the second insulating layer 46 may be further included. The second insulating layer 46 here may be disposed on the side of the first insulating layer 42 adjacent to the substrate 41. On the basis of such structure, the present disclosure may further configure that the opening combination 20 may include the third opening 23 in addition to the first opening 21 and the second opening 22. At this point, the second opening 22 may be formed through the first insulating layer 42, and the third opening 23 may be formed through entire second insulating layer 46; or the third opening 23 may be formed by removing a part of the second insulating layer 46 from the surface of the second insulating layer 46, on the side away from the substrate 41, toward the side of the substrate 41, and the second opening 22 and the third opening 23 may be connected with each other.

At this point, the diameter of the third opening 23 may be configured to be smaller than the diameter of the second opening 22, and the orthographic projection of the third opening 23 on the plane of the substrate 41 may be configured to be within the orthographic projection of the second opening 22 on the plane of the substrate 41. It is equivalent to that the first electrode layer 43 formed by the second opening 22 and the third opening 23 facing the inside of the opening may form a stepped arrangement, and the first electrode layer 43 may have an inclined surface relative to the plane of the substrate 41. Similarly, the specific reflection of the incident light through the first opening 21 may be realized by the first electrode layer 43 with a larger inclined surface, and a part of the light may be reflected and absorbed by the light-blocking layer 44. In addition, using same principle as shown in FIG. 14, in the present disclosure, by configuring the third sidewall 53 not in the extending direction of the first sidewall 51, a part of the incident light may be reflected to the surface of the light-blocking layer 44 to be absorbed instead of being reflected to the first opening

21 to exit. Therefore, the number of light rays exiting from the first opening 21 after being reflected by the first electrode layer 43 may be reduced, and the influence of the reflected light rays on the display effect of the display panel 100 may be weakened. That is, in the present disclosure, the incident light may be reflected in a specific direction through the first electrode layer 43 with a specific structure, thereby realizing the customized direction reflection of the ambient light. Therefore, the number of light rays exiting from the first opening 21 after being reflected by the first electrode layer 43 may be reduced, and the influence of the reflected light rays on the display effect of the display panel 100 may be weakened, which may be beneficial for improving the display uniformity of the display panel 100 and further improving the user experience.

Figure 19:
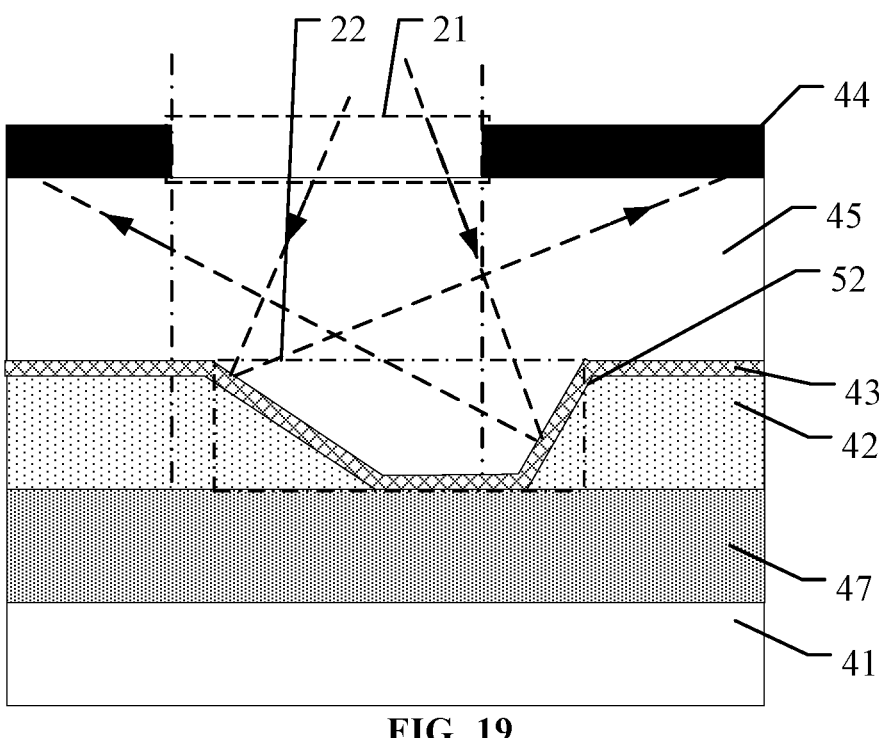
FIG. 19 illustrates another cross-sectional view along an AA' direction in FIG. 3 according to various embodiments of the present disclosure.

FIG. 19 illustrates another cross-sectional view along the AA' direction in FIG. 3 according to various embodiments of the present disclosure. Referring to FIGS. 1, 2 and 19, optionally, the display panel 100 may further include a planarization layer 47; and the planarization layer 47 may be between the first insulating layer 42 and the substrate 41.

The second opening 22 may expose the planarization layer 47.

For example, the present disclosure provides an optional configuration manner as the following. On the basis that the display panel 100 includes the substrate 41, the first insulating layer 42, the first electrode layer 43 and the light-blocking layer 44, the display panel 100 may further include the planarization layer 47. The planarization layer 47 may be disposed between the first insulating layer 42 and the substrate 41. The present disclosure provides an optional configuration manner that the second opening 22 may pass through entire first insulating layer 42 and expose a side surface of the planarization layer 47 away from the substrate 41. In such way, the second opening 22 may be formed only by etching the first insulating layer 42 or other operations, or the position of the second opening 22 may be reserved when the first insulating layer 42 is prepared, which may have a simple fabrication process.

The second opening 22 may be formed through entire first insulating layer 42, and the present disclosure may not limit the shape of the second opening 22 herein. For example, the second opening 22 may include an inclined surface, a curved surface, and the like. The first electrode layer 43 may be formed on the side of the inclined surface/curved surface included in the second opening 22 toward the inside of the opening. The first electrode layer 43 herein may include a corresponding inclined surface/curved surface. The specific reflection of the incident light through the first opening 21 may be achieved by the first electrode layer 43 including the inclined surface/curved surface, and a part of the light is reflected to the light-blocking layer 44 to be absorbed. In such way, the incident light may be reflected in a specific direction through the first electrode layer 43 with a specific structure, thereby realizing the customized direction reflection of the ambient light. Therefore, the number of light rays exiting from the first opening 21 after being reflected by the first electrode layer 43 may be reduced, and the influence of the reflected light rays on the display effect of the display panel 100 may be weakened, which may be beneficial for improving the display uniformity of the display panel 100 and further improving the user experience.

Figure 20:
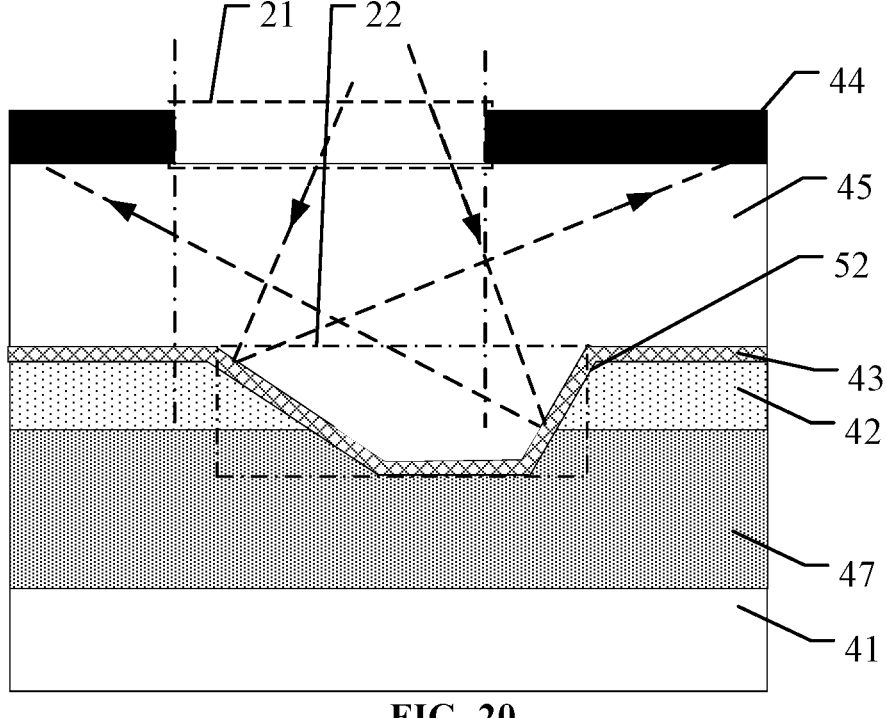
FIG. 20 illustrates another cross-sectional view along an AA' direction in FIG. 3 according to various embodiments of the present disclosure.

FIG. 20 illustrates another cross-sectional view along the AA' direction in FIG. 3 according to various embodiments of the present disclosure. Referring to FIGS. 1, 3 and 20, optionally, the display panel 100 may further include the planarization layer 47; and the planarization layer 47 may be between the first insulating layer 42 and the substrate 41.

The second opening 22 may pass through the first insulating layer 42 and may be located in at least a part of the planarization layer 47.

For example, the present disclosure provides an optional configuration manner as the following. On the basis that the display panel 100 includes the substrate 41, the first insulating layer 42, the first electrode layer 43 and the light-blocking layer 44, the planarization layer 47 may be further included. The planarization layer 47 may be disposed between the first insulating layer 42 and the substrate 41. The present disclosure provides an optional configuration manner that the second opening 22 may pass through entire first insulating layer 42; furthermore, from the side surface of the planarization layer 47, which is away from the substrate 41, to the side of the substrate 41, a part or all of the planarization layer 47 may be removed to form another part of the second opening 22.

The second opening 22 may be formed through the first insulating layer 42 or through the first insulating layer 42 and at least a part of the planarization layer 47; and the present disclosure may not limit the shape of the second opening 22 herein. For example, the second opening 22 may include an inclined surface, a curved surface, and the like. The first electrode layer 43 may be formed on the side of the inclined surface/curved surface included in the second opening 22 toward the inside of the opening. The first electrode layer 43 herein may include a corresponding inclined surface/curved surface. The specific reflection of the incident light through the first opening 21 may be achieved by the first electrode layer 43 including the inclined surface/curved surface, and a part of the light is reflected to the light-blocking layer 44 to be absorbed. In such way, the incident light may be reflected in a specific direction through the first electrode layer 43 with a specific structure, thereby realizing the customized direction reflection of the ambient light. Therefore, the number of light rays exiting from the first opening 21 after being reflected by the first electrode layer 43 may be reduced, and the influence of the reflected light rays on the display effect of the display panel 100 may be weakened, which may be beneficial for improving the display uniformity of the display panel 100 and further improving the user experience.

In addition, in the present disclosure, after passing through the first insulating layer 42, the second opening 22 may be further formed by passing through at least a part of the planarization layer 47. Under such a structure, compared with that the second opening 22 is only formed through the first insulating layer 22, the first electrode layer 43 with the non-planar structure at the second opening 22 may have a larger surface area, and the area of inclined surface thereof may also be relatively large. Through the first electrode layer 43 of the non-planar structure with a larger area, a larger number of incident light rays may be reflected in a specific direction, or the incident light rays may be reflected multiple times. Therefore, the number of light rays exiting from the first opening 21 after being reflected by the first electrode layer 43 may be reduced, or the illumination intensity of the light exiting from the first opening 21 after being repeatedly reflected by the first electrode layer 43 may be weaken, which may be beneficial for reducing the reflectivity of the display panel 100.

Figure 21:
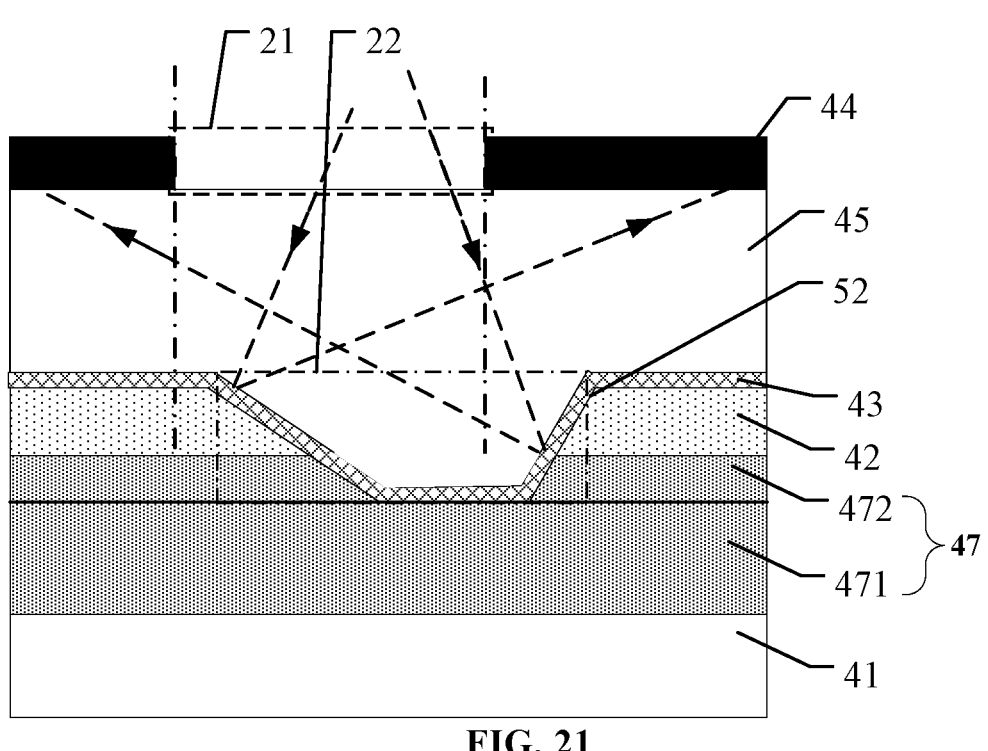
FIG. 21 illustrates another cross-sectional view along an AA' direction in FIG. 3 according to various embodiments of the present disclosure.

FIG. 21 illustrates another cross-sectional view along the AA' direction in FIG. 3 according to various embodiments of the present disclosure. Referring to FIGS. 1, 3 and 21, optionally, the display panel 100 may further include the planarization layer 4; and the planarization layer 47 may be between the first insulating layer 42 and the substrate 41.

The planarization layer 47 may include a first planarization layer 471 and a second planarization layer 472; and the first planarization layer 471 may be between the second planarization layer 472 and the substrate 41.

The second opening 22 may pass through the first insulating layer 42 and the second planarization layer 472.

For example, the present disclosure provides an optional configuration manner as the following. On the basis that the display panel 100 includes the substrate 41, the first insulating layer 42, the first electrode layer 43 and the light-blocking layer 44, the planarization layer 47 may be further included. The planarization layer 47 may be disposed between the first insulating layer 42 and the substrate 41. The present disclosure provides an optional configuration manner that the planarization layer 47 may include the first planarization layer 471 and the second planarization layer 472; and the first planarization layer 471 may be between the second planarization layer 472 and the substrate 41. At this point, on the basis that the second opening 22 passes through entire first insulating layer 42, from the side surface of the second planarization layer 472, which is away from the substrate 41, to the side of the substrate 41, a part or all of the first planarization layer 471 may be removed to form another part of the second opening 22.

The second opening 22 may be formed through the first insulating layer 42 and the second planarization layer 472. Compared with forming the second opening 22 only in the first insulating layer 42, the surface area of the first electrode layer 43 with the non-planar structure at the second opening 22 may be increased, and the area of the inclined surface thereof may be also relatively increased. Through the first electrode layer 43 of the non-planar structure with a larger area, a larger number of incident light rays may be reflected in a specific direction, or the incident light rays may be reflected multiple times. Therefore, the number of light rays exiting from the first opening 21 after being reflected by the first electrode layer 43 may be reduced, or the illumination intensity of the light emitted from the first opening 21 after being repeatedly reflected by the first electrode layer 43 may be weaken, which may be beneficial for reducing the reflectivity of the display panel 100. The present disclosure may not limit the shape of the second opening 22 here. For example, the second opening 22 may include an inclined surface, a curved surface and the like. The first electrode layer 43 may be formed on the side of the inclined surface/curved surface included in the second opening 22 toward the inside of the opening. The first electrode layer 43 herein may include a corresponding inclined surface/curved surface. The specific reflection of the incident light through the first opening 21 may be achieved by the first electrode layer 43 including the inclined surface/curved surface, and a part of the light is reflected to the light-blocking layer 44 to be absorbed. In such way, the incident light may be reflected in a specific direction through the first electrode layer 43 with a specific structure, thereby realizing the customized direction reflection of the ambient light. Therefore, the number of light rays exiting from the first opening 21 after being reflected by the first electrode layer 43 may be reduced, and the influence of the reflected light rays on the display effect of the display panel 100 may be weakened, which may be beneficial for improving the display uniformity of the display panel 100 and further improving the user experience.

Figure 22:
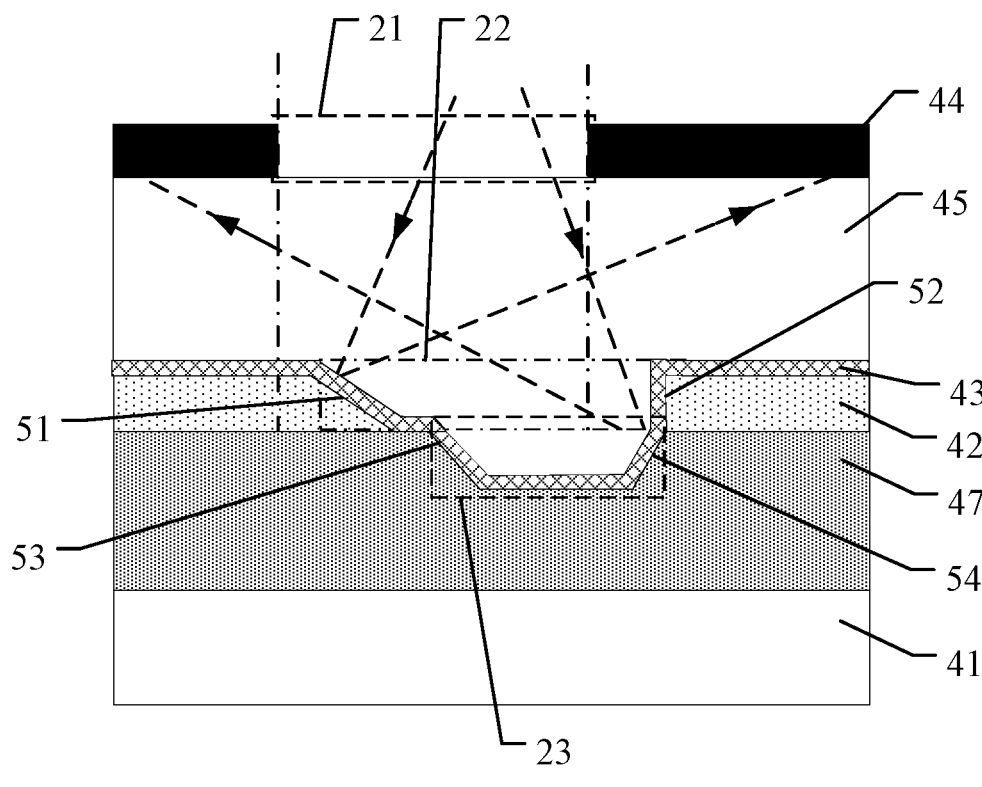
FIG. 22 illustrates another cross-sectional view along a CC' direction in FIG. 17 according to various embodiments of the present disclosure.

FIG. 22 illustrates another cross-sectional view along the CC' direction in FIG. 17 according to various embodiments of the present disclosure. Referring to FIGS. 1, 17 and 22, optionally, the display panel 100 may further include the planarization layer 47; and the planarization layer 47 may be between the first insulating layer 42 and the substrate 41.

The opening combination 20 may further include the third opening 23; and the third opening 23 may pass through at least a part of the planarization layer 47.

The second opening 22 may include the first sidewall 51 and the second sidewall 52; the third opening 23 may include the third sidewall 53 and the fourth sidewall 54; the orthographic projection of the fourth sidewall 54 on the plane of the substrate 41 may be at least partially overlapped with the orthographic projection of the second sidewall 52 on the plane of the substrate 41; and the orthographic projection of the third sidewall 53 on the plane of the substrate 41 may be within the orthographic projection of the second opening 22 on the plane of the substrate 41.

For example, the present disclosure provides an optional configuration manner as the following. On the basis that the display panel 100 includes the substrate 41, the first insulating layer 42, the first electrode layer 43 and the light-blocking layer 44, the planarization layer 47 may be further included. The planarization layer 47 may be disposed between the first insulating layer 42 and the substrate 41. At this point, in the present disclosure, on the basis that the display panel 100 includes the first opening 21 and the second opening 22, the third opening 23 may be further configured in the planarization layer 47. The third opening 23 herein may be formed by removing a part or all of the planarization layer 47 from the side surface of the planarization layer 47 away from the substrate 41 to the side of the substrate 41 side; and the second opening 22 may be connected to the third opening 23.

At this point, the second opening 22 may include the first sidewall 51 and the second sidewall 52; and corresponding position of the third opening 23 may include the third sidewall 53 and the fourth sidewall 54. At this point, the orthographic projection of the fourth sidewall 54 on the plane of the substrate 41 may be configured to be partially overlapped with the orthographic projection of the second sidewall 52 on the plane of the substrate 41; and the orthographic projection of the third sidewall 53 on the plane of the substrate 41 may be configured to be within the orthographic projection of the second opening 22 on the plane of the substrate 41, which is equivalent to that at the side where the second sidewall 52 and the fourth sidewall 54 are configured, the opening inside space of the second opening 22 at the side away from the inside of the opening (e.g., away from the substrate 41) may be greater than the opening inside space of the third opening 23 at the side away from the inside of the opening (e.g., away from the substrate 41).

The first electrode layer 43 may be configured to be formed at the second opening 22 and the third opening 23 toward inside of the opening in above-mentioned structure.

The first electrode layer 43 may include an inclined surface relative to the plane of the substrate 41. Compared with that there is an inclined surface relative to the plane of the substrate 41, the specific reflection of the incident light through the first opening 21 may be realized by the first electrode layer 43 with a larger inclined surface, and a part of the light may be reflected to the light-blocking layer 44 to be absorbed. In addition, using same principle as shown in FIG. 14, in the present disclosure, by configuring the third sidewall 53 not in the extending direction of the first sidewall 51, a part of the incident light may be reflected to the surface of the light-blocking layer 44 to be absorbed instead of being reflected to the first opening 21 to exit.

Therefore, the number of light rays exiting from the first opening 21 after being reflected by the first electrode layer 43 may be reduced. That is, in the present disclosure, the incident light may be reflected in a specific direction through the first electrode layer 43 with a specific structure, thereby realizing the customized direction reflection of the ambient light. Therefore, the number of light rays exiting from the first opening 21 after being reflected by the first electrode layer 43 may be reduced, and the influence of the reflected light rays on the display effect of the display panel 100 may be weakened, which may be beneficial for improving the display uniformity of the display panel 100 and further improving the user experience.

Figure 23:
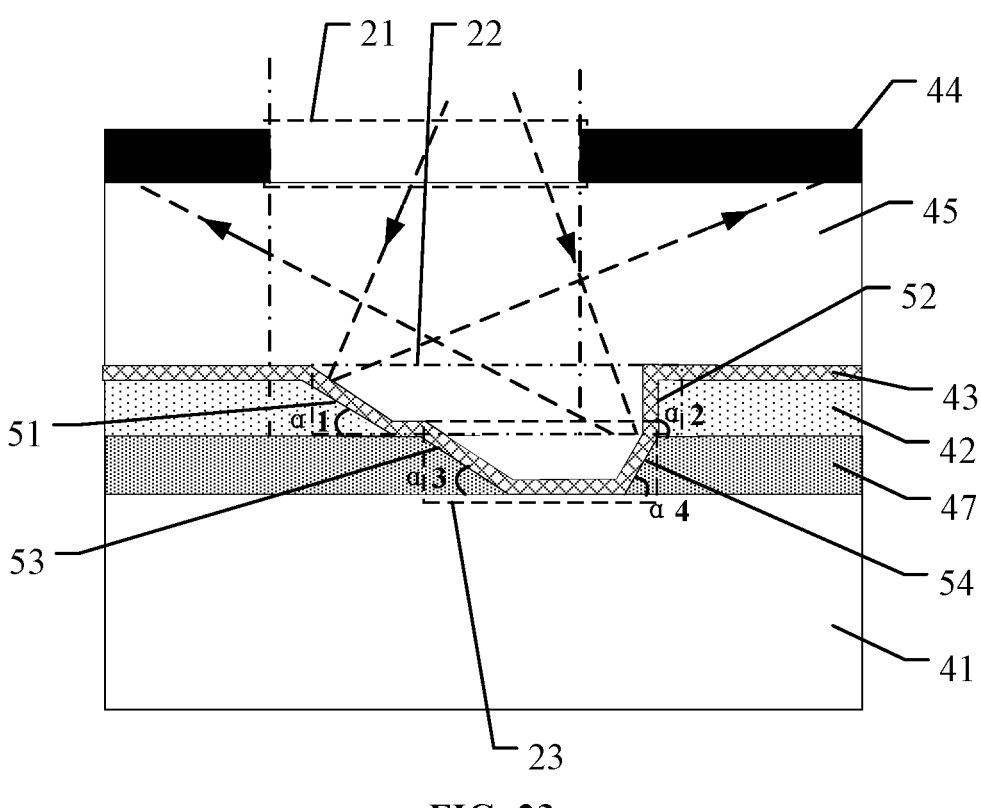
FIG. 23 illustrates another cross-sectional view along a CC' direction in FIG. 17 according to various embodiments of the present disclosure.

FIG. 23 illustrates another cross-sectional view along the CC' direction in FIG. 17 according to various embodiments of the present disclosure. Referring FIGS. 1, 17 and 23, on the basis of such structure, optionally, the first sidewall 51 and the bottom surface of the first insulating layer 42 may form the first angle α1, and the third sidewall 53 and the bottom surface of the layer 47 may form the third angle α3. The first angle α1 and the third angle α3 may be both acute angles, and the third angle α3 may be equal to the first angle α1. For example, it may configure that the first angle α1 may be formed between the plane where the first sidewall 51 is located and the bottom surface of the first insulating layer 42; and the third angle α3 may be formed between the plane where the third sidewall 53 is located and the bottom surface of the planarization layer 47. The first angle α1 and the third angle α3 may be both acute angles, and the sizes of the first angle α1 and the second angle α2 may be selected to be same. In addition, the sizes of the first angle α1 and the second angle α2 may also be set to be different, which may not be limited in present disclosure, as long as the light incident through the first opening 21 may be specifically reflected by the first electrode layer 43 formed in the second opening 22 and the third opening 23 toward the inside of the opening, and a part of the light may be reflected to the light-blocking layer 44 to be absorbed.

As disclosed above, the non-planar structure of the first electrode layer 43 in the present disclosure may have a variety of surfaces with different degrees of inclination and different inclination directions, such that the light incident through the first opening 21 may be reflected once or multiple times by the first electrode layer 43 of the non-planar structure. As mentioned above, the non-planar structure of the first electrode layer 43 may make a part of the incident light finally reflected to the light-blocking layer 44 to be absorbed or make the intensity of the light become weaker after a part of the light is reflected multiple times, which may both be beneficial for reducing the reflectivity of the display panel 100 and improving the display effect of the display panel 100.

Referring to FIGS. 1, 3, 17, 22 and 23, optionally, the display panel 100 may further include the planarization layer 47; and the planarization layer 47 may be between the first insulating layer 42 and the substrate 41.

The opening combination 20 may further include the third opening 23; and the third opening 23 may pass through at least a part of the planarization layer 47.

The orthographic projection of the third opening 23 on the plane of the substrate 41 may be within the orthographic projection of the second opening 22 on the plane of the substrate 41.

For example, the present disclosure provides an optional configuration manner as the following. On the basis that the display panel 100 includes the substrate 41, the first insulating layer 42, the first electrode layer 43 and the light-blocking layer 44, the planarization layer 47 may be further included. The planarization layer 47 may be disposed between the first insulating layer 42 and the substrate 41. At this point, in the present disclosure, on the basis that the display panel 100 includes the first opening 21 and the second opening 22, the third opening 23 may be further configured in the planarization layer 47. The third opening 23 herein may be formed by removing a part or all of the planarization layer 47 from the side surface of the planarization layer 47 away from the substrate 41 to the side of the substrate 41 side; and the second opening 22 may be connected to the third opening 23.

At this point, the diameter of the third opening 23 may be configured to be smaller than the diameter of the second opening 22, and the orthographic projection of the third opening 23 on the plane of the substrate 41 may be configured to be within the orthographic projection of the second opening 22 on the plane of the substrate 41. It is equivalent to that the first electrode layer 43 formed by the second opening 22 and the third opening 23 facing the inside of the opening may form a stepped arrangement, and the first electrode layer 43 may have an inclined surface relative to the plane of the substrate 41. Similarly, the specific reflection of the incident light through the first opening 21 may be realized by the first electrode layer 43 with a larger inclined surface, and a part of the light may be reflected and absorbed by the light-blocking layer 44. Furthermore, the extending direction of the first sidewall 51 and the extending direction of the third sidewall 53 may be configured to be different. As same principle shown in FIG. 14, more incident light may be reflected in a specific direction through the first electrode layer 43 of a specific structure, thereby realizing the reflection of the customized direction of the ambient light. Therefore, the number of light rays exiting from the first opening 21 after being reflected by the first electrode layer 43 may be further reduced, and the influence of the reflected light rays on the display effect of the display panel 100 may be weakened, which may be beneficial for improving the display uniformity of the display panel 100 and further improving the user experience.

Referring to FIGS. 1, 3, and 4-23, optionally, the first opening 21 may have a first symmetry axis 61 extending along the direction perpendicular to the plane of the display panel 100; the second opening 22 may have a second symmetry axis 62 extending along the direction perpendicular to the plane of the display panel 100; and the first symmetry axis 61 may not be overlapped with the second symmetry axis 62.

For example, the opening combination 20 provided in the present disclosure may be designed to be asymmetric. The configuration manner of the opening combination 20 may be that when the symmetry axis (the first symmetry axis 61) of the first opening 21 in the plane of the display panel 100 is in parallel with the symmetry axis (the second symmetry axis 62) of the second opening 22 in the plane of the display panel 100, the first symmetry axis 61 may not be overlapped with the second symmetry axis 62. Herein, the present disclosure may not limit whether the diameters of the first opening 21 and the second opening 22 are same, as long as a certain distance is between respective symmetry axes of the first opening 21 and the second opening 22. As same principle shown in FIG. 5, by configuring the opening combination 20 to be asymmetrically designed, for the light incident from the first opening 21 to the surface of the first electrode layer 43 at corresponding position of the second opening 22, at least a part of the light may be reflected to the light-blocking layer 44, adjacent to the first opening 21, to be absorbed by the light-blocking layer 44, but not be reflected twice and then exit from the first opening 21. Therefore, the light incident from the first opening 21 to the surface of the first electrode layer 43 at corresponding position of the second opening 22 may not all be reflected to the first opening 21 to exit. That is, the light exiting from the first opening 21 after being reflected by the first electrode layer 43 may be reduced or even eliminated, and the influence of the reflected light on the display effect of the display panel 100 may be weakened, thereby being beneficial for improving the display uniformity of the display panel 100 and further improving the user experience.

Referring to FIGS. 1, 3, and 4-23, optionally, the diameter of the first opening 21 and the diameter of the second opening 22 may be same.

For example, in any opening combination 20 provided in present disclosure, the diameters of the first opening 21 and the second opening 22 may be same. For example, when the first opening 21 and the second opening 22 are both circles, the areas of the orthographic projections of the first opening 21 and the second opening 22 on the plane of the display panel 100 may be configured to be same. At this point, optionally, it may configure that the orthographic projection of the center 210 of the first opening 21 on the plane of the substrate 41 may not be overlapped with the orthographic projection of the center 220 of the second opening 22 on the plane of the substrate 41, thereby ensuring that the first opening 21 and the second opening 22 in the opening combination 20 are designed to be asymmetric. And/or, corresponding first electrode layer 43 in the second opening 22 may also be selected to be non-planar. For the light incident from the first opening 21 to the surface of the first electrode layer 43 at corresponding position of the second opening 22, at least a part of the light may be reflected to the light-blocking layer 44, adjacent to the first opening 21, to be absorbed by the light-blocking layer 44. Therefore, the light incident from the first opening 21 to the surface of the first electrode layer 43 at corresponding position of the second opening 22 may not all be reflected to the first opening 21 to exit; the light exiting from the first opening 21 after being reflected by the first electrode layer 43 may be reduced; and the influence of reflected light on the display effect of the display panel 100 may be weakened, thereby being beneficial for improving the display uniformity of the display panel 100 and further improving the user experience.

Referring to FIGS. 1, 3, and 4-23, optionally, the first spacing D may be between the edge of the orthographic projection of the first opening 21 on the plane of the substrate 41 and the edge of the orthographic projection of the second opening 22 on the plane of the substrate 41; the radius of the first opening 21 is R; and D≤0.3154R.

For example, the present disclosure provides an optional embodiment that the orthographic projection of the first opening 21 on the plane of the substrate 41 and the orthographic projection of the second opening 22 on the plane of the substrate 41 may include a non-overlapped portion. At this point, the first spacing D may be between the edge of the orthographic projection of the first opening 21 on the plane of the substrate 41 and the edge of the orthographic projection of the second opening 22 on the plane of the substrate 41.

For example, when the diameter of the first opening 21 and the diameter of the second opening 22 are set to be same, the radius is R, and the first spacing is D. A line connecting the center of the circle and an intersection may be obtained, and a perpendicular line may be drawn from the intersection as shown in drawings. Let the opening angle be θ, then it may obtain cos(θ)=D/2R. The pie-shaped area corresponding to the opening angle 2θ may be S=R^2θ; the pie-shaped area subtracts the area of the triangle to obtain the intersection area of the two circles as S=2R^2θ−DR sin θ, which may determine the magnitude of the transmittance. When the stagged distance increases, the transmittance may decrease while the anti-reflection effect is improved according to T %=S/πR2. Taking the current light-transmitting hole standard of 1.25% and the minimum acceptable range of 1%, the acceptable range may be T % 80%; and D≤0.3154R may be obtained by substitution.

Optionally, the diameter of the first opening 21 may be smaller than the diameter of the second opening 22.

For example, any opening combination 20 provided in present disclosure may be provided with the first opening 21 and the second opening 22 having different diameters. For example, when both the first opening 21 and the second opening 22 are circles, the diameter of the first opening 21 may be configured to be smaller than the diameter of the second opening 22. At this point, optionally, it may configure that the orthographic projection of the center 210 of the first opening 21 on the plane of the substrate 41 may not be overlapped with the orthographic projection of the center 220 of the second opening 22 on the plane of the substrate 41, thereby ensuring that the opening combination 20 is an asymmetric design. And/or, corresponding first electrode layer 43 in the second opening 22 may also be selected to be non-planar. For the light incident from the first opening 21 to the surface of the first electrode layer 43 at corresponding position of the second opening 22, at least a part of the light may be reflected to the light-blocking layer 44, adjacent to the first opening 21, to be absorbed by the light-blocking layer 44. Therefore, the light incident from the first opening 21 to the surface of the first electrode layer 43 at corresponding position of the second opening 22 may not all be reflected to the first opening 21 to exit; the light emitted from the first opening 21 after being reflected by the first electrode layer 43 may be reduced; and the influence of reflected light on the display effect of the display panel 100 may be weakened, thereby being beneficial for improving the display uniformity of the display panel 100 and further improving the user experience.

Figure 24:
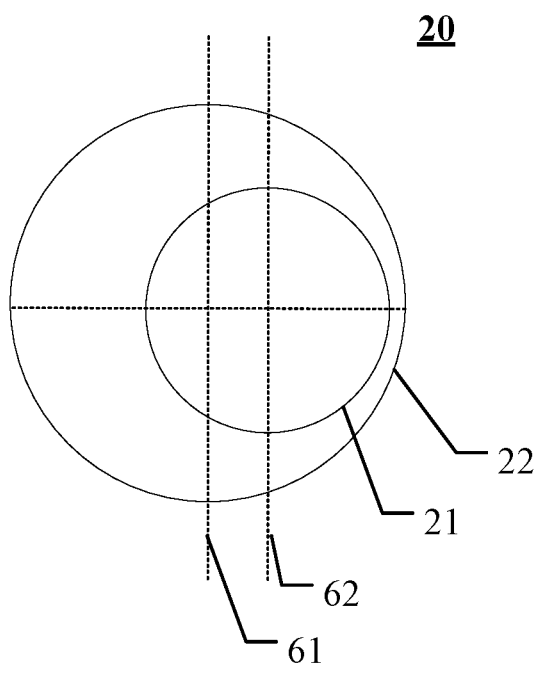
FIG. 24 illustrates another perspective view of an opening combination in FIG. 1 according to various embodiments of the present disclosure.

FIG. 24 illustrates another perspective view of an opening combination in FIG. 1 according to various embodiments of the present disclosure. Referring to FIG. 24 in conjunction with above-mentioned cross-sectional views, optionally, the orthographic projection of the first opening 21 on the plane of the substrate 41 may be within the orthographic projection of the second opening 22 on the plane of the substrate 41.

For example, any opening combination 20 provided in present disclosure may be provided with the first opening 21 and the second opening 22 having different diameters. For example, when both the first opening 21 and the second opening 22 are circles, the diameter of the first opening 21 may be configured to be smaller than the diameter of the second opening 22. At this point, the orthographic projection of the first opening 21 on the plane of the substrate 41 may be further configured to be within the orthographic projection of the second opening 22 on the plane of the substrate 41, and the ambient light incident from the first opening 21 may strike the surface of the first electrode layer 43 at the position corresponding to the second opening 22. At this point, for example, the surface of the first electrode layer 43 for receiving the incident ambient light may be configured to include a non-planar surface, thereby achieving specific reflection of the incident light through the first opening 21.

A part of the light may be reflected to the light-blocking layer 44 to be absorbed. Therefore, the number of light rays exiting from the first opening 21 after being reflected by the first electrode layer 43 may be reduced, and the influence of the reflected light rays on the display effect of the display panel 100 may be weakened, which may be beneficial for improving the display uniformity of the display panel 100 and further improving the user experience.

Referring to FIGS. 1, 3 and 7, optionally, the second opening 22 may include the first sidewall 51; the first sidewall 51 and the bottom surface of the first insulating layer 42 may form the first angle α1; and the degree range of the first angle α1 may be from about 20° to about (i.e., 20°≤α1≤40°).

For example, the present disclosure provides the first angle α1 formed between the plane where the first sidewall 51 of the second opening 22 is located and the bottom surface of the first insulating layer 42, and the angle degree may range from 20° to 40° (including the origin value), such that the first sidewall 51 may have a certain degree of inclination, and the degree of inclination may not be excessively large. The value of the first angle α1 within such range may also make the area of the first sidewall 51 to be sufficiently large. Excessively large angle may make the area of the first sidewall 51 to be relatively small. The specific reflection of the incident light through the first opening 21 may be achieved by the first electrode layer 43 with a larger inclined surface, a part of the light may be reflected to the light-blocking layer 44 to be absorbed. In such way, the incident light may be reflected in a specific direction through the first electrode layer 43 of a specific structure, thereby realizing the customized direction reflection of the ambient light. Therefore, the number of light rays exiting from the first opening 21 after being reflected by the first electrode layer 43 may be reduced, the influence of the reflected light rays on the display effect of the display panel 100 may be weakened, which may be beneficial for improving the display uniformity of the display panel 100 and further improving the user experience.

Figure 25:
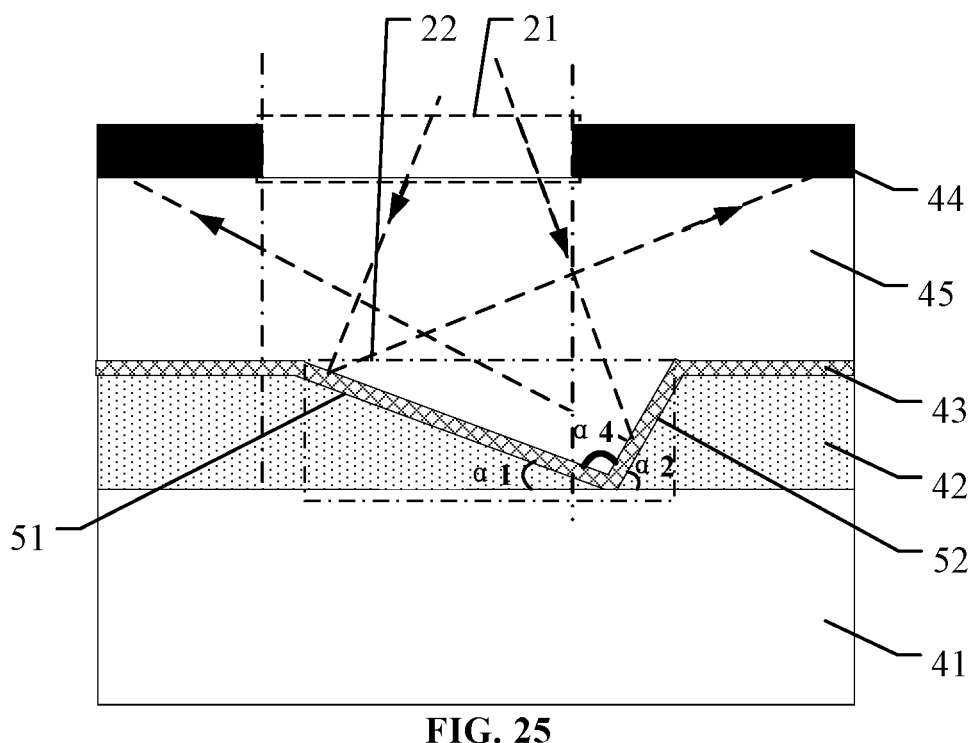
FIG. 25 illustrates another cross-sectional view along an AA' direction in FIG. 3 according to various embodiments of the present disclosure.

FIG. 25 illustrates another cross-sectional view along the AA' direction in FIG. 3 according to various embodiments of the present disclosure. Referring to FIGS. 1, 3 and 25, optionally, the second opening 22 may include the first sidewall 51 and the second sidewall 52; and the first sidewall 51 may be connected to the second sidewall 52.

The orthographic projection of the second sidewall 52 on the plane of the substrate 41 may be on the first side of the orthographic projection of the geometric center of the second opening 22 on the plane of the substrate 41.

For example, the present disclosure also provides a non-planar design manner of the first electrode layer 43 at the position of the second opening 22 as the following. The first sidewall 51 and the second sidewall 52 included in the second opening 22 may be directly connected to each other; and the connection between the first sidewall 51 and the second sidewall 52 may not be realized through other planes therebetween. At this point, the first electrode layer 43 at the position of the second opening 22 may include at least two connecting inclined surfaces. In the present disclosure, when the orthographic projection of the geometric center of the second opening 22 on the plane of the substrate 41 is located on the first side of the orthographic projection of the geometric center of the first opening 21 on the plane of the substrate 41, the orthographic projection of the second sidewall 52 on the plane of the substrate 41 may be configured to be on the first side of the orthographic projection of the geometric center of the second opening 22 on the plane of the substrate 41. Therefore, the first electrode layer 43 disposed on the surface of the first sidewall 51 may reflect more incident light to the light-blocking layer 44, thereby avoiding poor reflectivity of the display panel 100 caused by the reflected light.

That is, through above configuration, the incident light may be reflected in a specific direction through the first electrode layer 43 with a specific inclined surface, thereby realizing the customized direction reflection of the ambient light. Therefore, the number of light rays exiting from the first opening 21 after being reflected by the first electrode layer 43 may be reduced, the influence of the reflected light rays on the display effect of the display panel 100 may be weakened, which may be beneficial for improving the display uniformity of the display panel 100 and further improving the user experience.

Referring to FIGS. 1, 3 and 25, optionally, in the second opening 22, a fourth angle may be formed between the first sidewall 51 and the second sidewall 52; and the degree range of the fourth angle may be from about 90° to about 180° (i.e., 90°≤α4≤180°).

For example, the present disclosure also provides a non-planar design manner of the first electrode layer 43 at the position of the second opening 22 as the following. The first sidewall 51 and the second sidewall 52 included in the second opening 22 may be directly connected to each other; and the connection between the first sidewall 51 and the second sidewall 52 may be not realized through other planes therebetween. At this point, the first electrode layer 43 at the position of the second opening 22 may include at least two connecting inclined surfaces. In present disclosure, the fourth angle may be formed between the first sidewall 51 and the second sidewall 52, and the value range of the fourth angle may be between (excluding the origin value), such that the area of the inclined surface of the first electrode layer 43 may be relatively large. If the angle is excessively large, the area of the first sidewall 51 may be relatively reduced. The specific reflection of the incident light through the first opening 21 may be achieved by the first electrode layer 43 with a larger inclined surface, and a part of the light may be reflected to the light-blocking layer 44 to be absorbed. Therefore, the incident light may be reflected in a specific direction through the first electrode layer 43 with a specific structure, thereby realizing the customized direction reflection of the ambient light. Therefore, the number of light rays exiting from the first opening 21 after being reflected by the first electrode layer 43 may be reduced, the influence of the reflected light rays on the display effect of the display panel 100 may be weakened, which may be beneficial for improving the display uniformity of the display panel 100 and further improving the user experience.

Figure 26:
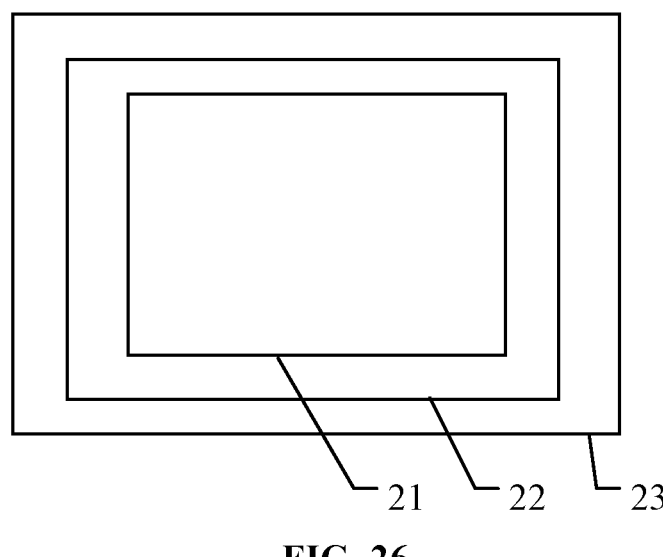
FIG. 26 illustrates another perspective view of an opening combination in FIG. 1 according to various embodiments of the present disclosure.
Figures 27, 28:
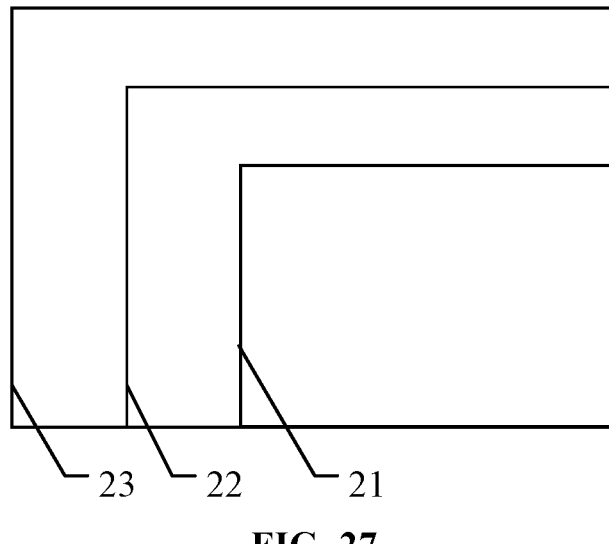
FIG. 27 illustrates another perspective view of an opening combination in FIG. 1 according to various embodiments of the present disclosure.
FIG. 28 illustrates a cross-sectional view of an opening combination according to various embodiments of the present disclosure.
Figure 29:
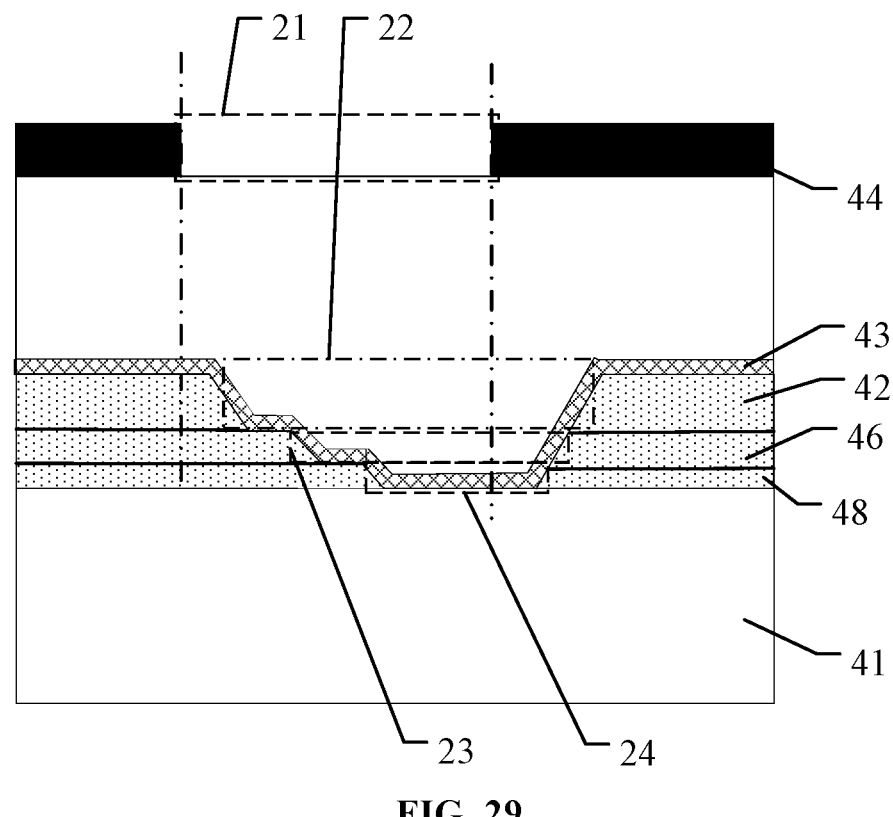
FIG. 29 illustrates another cross-sectional view of an opening combination according to various embodiments of the present disclosure.

FIG. 26 illustrates another perspective view of an opening combination in FIG. 1 according to various embodiments of the present disclosure. FIG. 27 illustrates another perspective view of an opening combination in FIG. 1 according to various embodiments of the present disclosure. FIG. 28 illustrates a cross-sectional view of an opening combination according to various embodiments of the present disclosure. FIG. 29 illustrates another cross-sectional view of an opening combination according to various embodiments of the present disclosure. Referring to FIGS. 26-29, in addition to above-exemplified embodiment in which the openings in the opening combination 20 are circles, the top views of the first opening 21, the second opening 22, and the third opening 23 in the opening combination 20 may also be the squares shown in FIGS. 26-27; and the diameter of the second opening 22 may be configured to be larger than the diameter of the first opening 21, and the diameter of the third opening 23 may be configured to be larger than the diameter of the second opening 23. That is, the present disclosure may not limit the number of openings included in the opening combination 20, and the configuration manner of the openings may also be adjusted according to requirements.

In addition, FIGS. 28 and 29 show embodiments in which the opening combination 20 may include the first opening 21, the second opening 22, the third opening 23 and the fourth opening 24. The fourth opening 24 may be formed by the position of the film layer where the third insulating layer 48 is located; and the specific disposing positions among the first opening 21, the second opening 22, the third opening 23 and the fourth opening 24 may also be adjusted according to requirements.

Figure 30:
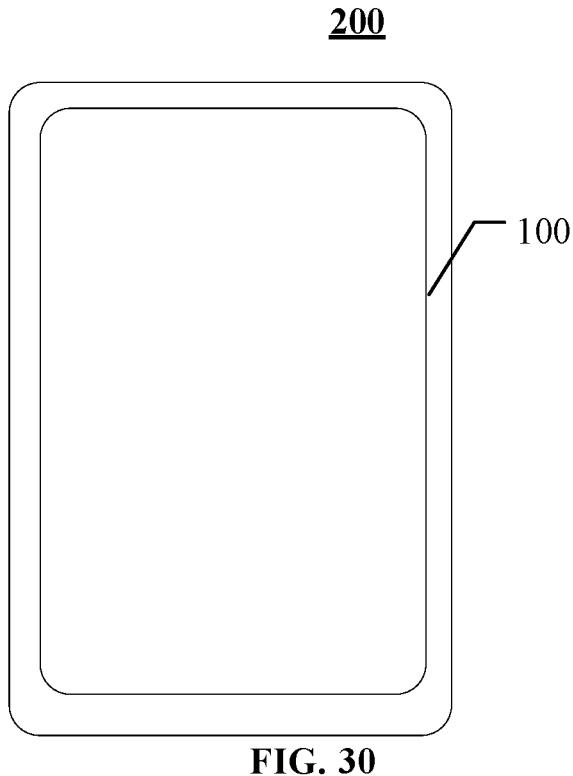
FIG. 30 illustrates a schematic of a display apparatus according to various embodiments of the present disclosure.

FIG. 30 illustrates a schematic of a display apparatus according to various embodiments of the present disclosure. Referring to FIG. 30 in conjunction with FIGS. 1-29, based on the same inventive concept, the present disclosure further provides a display apparatus 200 including a display panel 100. The display panel 100 may be any display panel 100 provided in present disclosure.

It should be noted that, for embodiments of the display apparatus 200 provided by the present disclosure, reference may be made to embodiments of the display panel 100 described above, which may not be repeated in detail. The display apparatus 200 provided in present disclosure may be any product or component with display function, such as a mobile phone, a tablet computer, a television, a monitor, a notebook computer, a navigator, and/or the like.

From above-mentioned embodiments, it may be seen that the display panel and the display apparatus provided by the present disclosure may achieve at least following beneficial effects.

The present disclosure provides the display panel and the display apparatus. The display panel may include the opening combination; the first opening in the opening combination may be configured through the light-blocking layer; and the second opening in the opening combination may be configured in the first insulating layer. In the present disclosure, the opening combination may be configured to be an asymmetric design; and/or the first electrode layer disposing at corresponding position of the second opening may be a non-planar structure, such that when the light incident from the first opening irradiates the surface of the first electrode layer, the incident light may not be completely reflected by the first electrode layer to the first opening to exit. That is, through the asymmetric configuration of the first opening and the second opening, at least a part of the light incident from the first opening may be reflected by the first electrode layer in the second opening to the surface of the light-blocking layer on the side adjacent to the first electrode layer and absorbed by the light-blocking layer. And/or, the ambient light entering from the first opening may be reflected in different directions through the non-planar first electrode layer, so that a part of the light may be reflected to the surface of the light-blocking layer adjacent to the first electrode layer and absorbed by the light-blocking layer. Therefore, the light exiting from the first opening after being reflected by the first electrode layer may be reduced, and the influence of the reflected light on the display effect of the display panel may be avoided, which may be beneficial for improving the display uniformity of the display panel and further improving the user experience.

Although some embodiments of the present disclosure have been described in detail through examples, those skilled in the art should understand that above-mentioned examples are provided for illustration only and not for the purpose of limiting the scope of the disclosure. Those skilled in the art should understand that modifications may be made to above-mentioned embodiments without departing from the scope and spirit of the present disclosure. The scope of the present disclosure may be defined by appended claims.

What is claimed is:

1. A display panel, comprising:

a substrate;

a first insulating layer, disposed on a side of the substrate;

a first electrode layer, disposed on a side of the first insulating layer away from the substrate;

a light-blocking layer, disposed on a side of the first electrode layer away from the first insulating layer;

an opening combination, including a first opening and a second opening which correspond to each other, wherein:

the first opening passes through the light-blocking layer along a direction perpendicular to a plane of the substrate; the second opening is at least in the first insulating layer; the opening combination includes an asymmetric design; or the first electrode layer at a position corresponding to the second opening is a non-planar structure; and a second insulating layer, wherein the second insulating layer is on a side of the first insulating layer adjacent to the substrate, wherein:

the opening combination further includes a third opening; the second opening passes through the first insulating layer; the third opening passes through at least a part of the second insulating layer; and the second opening at least partially overlaps the third opening;

a diameter of the second opening is different from a diameter of the third opening; and along the direction perpendicular to the plane of the substrate, the third opening does not overlap a light-emitting element.

2. The display panel according to claim 1, wherein:

in a same opening combination, an orthographic projection of the second opening on the plane of the substrate is at least partially overlapped with an orthographic projection of the first opening on the plane of the substrate.

3. The display panel according to claim 1, wherein:

the second opening includes a first sidewall and a second sidewall; the first sidewall and a bottom surface of the first insulating layer form a first angle; the second sidewall and the bottom surface of the first insulating layer form a second angle; the first angle and the second angle are both acute angles; and the first angle is less than the second angle.

4. The display panel according to claim 1, wherein:

at the position corresponding to the second opening, at least one side surface of the first electrode layer facing away from the substrate includes a curved surface.

5. The display panel according to claim 1, wherein:

at least one sidewall of the second opening is continuously extended with at least one sidewall of the third opening.

6. The display panel according to claim 5, wherein:

the second opening includes a first sidewall and a second sidewall; the third opening includes a third sidewall and a fourth sidewall; an orthographic projection of the fourth sidewall on the plane of the substrate is at least partially overlapped with an orthographic projection of the second sidewall on the plane of the substrate; and an orthographic projection of the third sidewall on the plane of the substrate is within an orthographic projection of the second opening on the plane of the substrate.

7. The display panel according to claim 6, wherein:

the first sidewall and a bottom surface of the first insulating layer form a first angle; the third sidewall and a bottom surface of the second insulating layer form a third angle; the first angle and the third angle are both acute angles; and the first angle is different from the third angle.

8. The display panel according to claim 1, wherein:

a degree of inclination of at least a part of a sidewall of the second opening with respect to the substrate is different from a degree of inclination of at least a part of a sidewall of the third opening with respect to the substrate.

9. The display panel according to claim 1, wherein:

an orthographic projection of the third opening on the plane of the substrate is within an orthographic projection of the second opening on the plane of the substrate.

10. The display panel according to claim 1, wherein:

the display panel further includes a planarization layer between the first insulating layer and the substrate; and the second opening exposes the planarization layer.

11. The display panel according to claim 1, wherein:

the display panel further includes a planarization layer between the first insulating layer and the substrate; and the second opening passes through the first insulating layer and is in at least a part of the planarization layer.

12. The display panel according to claim 1, wherein:

the display panel further includes a planarization layer between the first insulating layer and the substrate;

the planarization layer includes a first planarization layer and a second planarization layer; and the first planarization layer is between the second planarization layer and the substrate; and the second opening passes through the first insulating layer and the second planarization layer.

13. The display panel according to claim 1, wherein:

the display panel further includes a planarization layer between the first insulating layer and the substrate;

the third opening passes through at least a part of the planarization layer; and the second opening includes a first sidewall and a second sidewall; the third opening includes a third sidewall and a fourth sidewall; an orthographic projection of the fourth sidewall on the plane of the substrate is at least partially overlapped with an orthographic projection of the second sidewall on the plane of the substrate; and an orthographic projection of the third sidewall on the plane of the substrate is within an orthographic projection of the second opening on the plane of the substrate.

14. The display panel according to claim 13, wherein:

the first sidewall and a bottom surface of the first insulating layer form a first angle; the third sidewall and a bottom surface of the planarization layer form a third angle; the first angle and the third angle are both acute angles; and the first angle is different from the third angle.

15. The display panel according to claim 1, wherein:

the display panel further includes a planarization layer between the first insulating layer and the substrate;

the third opening passes through at least a part of the planarization layer; and an orthographic projection of the third opening on the plane of the substrate is within an orthographic projection of the second opening on the plane of the substrate.

16. The display panel according to claim 1, wherein:

the first opening includes a first symmetry axis extending along a direction perpendicular to a plane of the display panel; the second opening includes a second symmetry axis extending along the direction perpendicular to the plane of the display panel; and the first symmetry axis is not overlapped with the second symmetry axis.

17. The display panel according to claim 1, wherein:

a diameter of the first opening is same as a diameter of the second opening.

18. The display panel according to claim 17, wherein:

a first spacing D is between an edge of an orthographic projection of the first opening on the plane of the substrate and an edge of an orthographic projection of the second opening; a radius of the first opening is R; and $D \leq 0.3154R$.

19. The display panel according to claim 1, wherein:

a diameter of the first opening is less than a diameter of the second opening.

20. The display panel according to claim 19, wherein:

an orthographic projection of the first opening on the plane of the substrate is within an orthographic projection of the second opening on the plane of the substrate.

21. The display panel according to claim 1, wherein:

the second opening includes a first sidewall; the first sidewall and a bottom surface of the first insulating layer form a first angle; and a degree range of the first angle is from about 20° to about 40°.

22. The display panel according to claim 1, wherein:

the second opening includes a first sidewall and a second sidewall; and the first sidewall is connected to the second sidewall; and an orthographic projection of the second sidewall on the plane of the substrate is on a first side of an orthographic projection of a geometric center of the second opening on the plane of the substrate.

23. The display panel according to claim 22, wherein:

in the second opening, a fourth angle is formed between the first sidewall and the second sidewall; and a degree range of the fourth angle is from about 90° to about 180°.

24. A display apparatus, comprising:

a display panel, comprising:

a substrate;

a first insulating layer, disposed on a side of the substrate;

a first electrode layer, disposed on a side of the first insulating layer away from the substrate;

a light-blocking layer, disposed on a side of the first electrode layer away from the first insulating layer; and an opening combination, including a first opening and a second opening which correspond to each other, wherein:

the first opening passes through the light-blocking layer along a direction perpendicular to a plane of the substrate; the second opening is at least in the first insulating layer; the opening combination includes an asymmetric design; or the first electrode layer at a position corresponding to the second opening is a non-planar structure; and a second insulating layer, wherein the second insulating layer is on a side of the first insulating layer adjacent to the substrate, wherein:

the opening combination further includes a third opening; the second opening passes through the first insulating layer; the third opening passes through at least a part of the second insulating layer; and the second opening at least partially overlaps the third opening;

a diameter of the second opening is different from a diameter of the third opening; and along the direction perpendicular to the plane of the substrate, the third opening does not overlap a light-emitting element.

* * * * *